United States Patent
Shahroudi et al.

(10) Patent No.: US 10,712,373 B2
(45) Date of Patent: *Jul. 14, 2020

(54) FINGERPRINTING OF FLUID INJECTION DEVICES

(71) Applicant: Woodward, Inc., Fort Collins, CO (US)

(72) Inventors: Kamran Eftekhari Shahroudi, Fort Collins, CO (US); Suraj Nair, Fort Collins, CO (US)

(73) Assignee: Woodward, Inc., Fort Collins, CO (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/523,601

(22) Filed: Jul. 26, 2019

(65) Prior Publication Data

US 2019/0346490 A1 Nov. 14, 2019

Related U.S. Application Data

(63) Continuation of application No. 15/449,514, filed on Mar. 3, 2017, now Pat. No. 10,401,398.

(51) Int. Cl.
*G01R 19/04* (2006.01)
*G01R 17/00* (2006.01)
(Continued)

(52) U.S. Cl.
CPC ............ *G01R 19/04* (2013.01); *F02D 41/20* (2013.01); *F02D 41/248* (2013.01);
(Continued)

(58) Field of Classification Search
CPC .......... G01R 19/04; G01R 17/00; F02D 41/20
See application file for complete search history.

(56) References Cited

U.S. PATENT DOCUMENTS

| 4,790,277 A | 12/1988 | Schechter |
| 5,086,743 A | 2/1992 | Hickey |
| (Continued) | | |

FOREIGN PATENT DOCUMENTS

| DE | 102009033080 | 12/2010 |
| DE | 102014208753 | 11/2015 |
| (Continued) | | |

OTHER PUBLICATIONS

Faroogi et al., "Real Time Monitoring of Diesel Engine Injector Waveforms for Accurate Fuel Metering and Control," Journal of Control Science and Engineering, vol. 2013, Article ID 973141, published in 2013, 9 pages.
(Continued)

*Primary Examiner* — Manuel A Rivera Vargas
*Assistant Examiner* — Yaritza H Perez Bermudez
(74) *Attorney, Agent, or Firm* — Fish & Richardson P.C.

(57) ABSTRACT

The subject matter of this specification can be embodied in, among other things, a method for characterizing a fluid injector that includes receiving a collection of waveform data, identifying a pull locus, determining a detection threshold level value, identifying a first subset of the collection of data representative of a selected first electrical waveform of the collection of electrical waveforms, identifying an opening value, identifying a representative closing value, identifying an anchor value, identifying a second subset of the collection of data based on the collection of data, the pull locus, the first subset, and the opening value, identifying a maximum electrical value, identifying an opening locus based the collection of data, the anchor value, and the maximum electrical value, identifying a hold value, and providing characteristics associated with the fluid injector comprising the pull locus, the opening locus, the hold value, the anchor value, and the representative closing value.

20 Claims, 11 Drawing Sheets

(51) Int. Cl.
*F16K 37/00* (2006.01)
*F02D 41/20* (2006.01)
*F02D 41/24* (2006.01)
*H01F 7/18* (2006.01)
*F02D 41/22* (2006.01)

(52) U.S. Cl.
CPC ..... *F02D 41/2422* (2013.01); *F02D 41/2467* (2013.01); *F16K 37/0083* (2013.01); *G01R 17/00* (2013.01); *H01F 7/1805* (2013.01); *F02D 41/2096* (2013.01); *F02D 41/221* (2013.01); *F02D 2041/2037* (2013.01); *F02D 2041/2048* (2013.01); *F02D 2041/2055* (2013.01); *F02D 2200/063* (2013.01); *F02D 2200/0618* (2013.01); *H01F 7/1844* (2013.01)

(56) References Cited

U.S. PATENT DOCUMENTS

| | | | |
|---|---|---|---|
| 5,678,251 | A | 10/1997 | Getz |
| 5,701,870 | A | 12/1997 | Gottshall et al. |
| 5,920,004 | A | 7/1999 | Gottshall et al. |
| 5,986,871 | A | 11/1999 | Forck et al. |
| 6,026,780 | A | 2/2000 | Barnes et al. |
| 6,167,869 | B1 | 1/2001 | Martin et al. |
| 6,363,314 | B1 | 3/2002 | Hafner et al. |
| 6,371,077 | B1 | 4/2002 | McGee |
| 6,415,762 | B1 | 7/2002 | Hafner et al. |
| 6,453,874 | B1 | 9/2002 | Duffy et al. |
| 6,467,452 | B1* | 10/2002 | Duffy ............. F02D 41/3035 123/295 |
| 6,497,221 | B1 | 12/2002 | French et al. |
| 6,560,528 | B1 | 5/2003 | Gitlin et al. |
| 6,651,629 | B2 | 11/2003 | McCoy et al. |
| 6,889,121 | B1 | 5/2005 | Shahroudi et al. |
| 7,111,613 | B1 | 9/2006 | Barnes et al. |
| 7,979,194 | B2 | 7/2011 | Wilhelm et al. |
| 8,214,132 | B2 | 7/2012 | Bunni et al. |
| 8,807,120 | B2 | 8/2014 | Beer et al. |
| 9,228,525 | B2 | 1/2016 | Nistler et al. |
| 9,957,909 | B2 | 5/2018 | Denk |
| 10,401,398 | B2* | 9/2019 | Shahroudi ............. F02D 41/248 |
| 2002/0162542 | A1 | 11/2002 | Dutart et al. |
| 2002/0195081 | A1* | 12/2002 | McGee ............. F02D 41/045 123/299 |
| 2003/0062029 | A1 | 4/2003 | Oyama et al. |
| 2004/0065747 | A1 | 4/2004 | Petrone et al. |
| 2005/0066940 | A1 | 3/2005 | Sheikh et al. |
| 2007/0273246 | A1 | 11/2007 | Hopley et al. |
| 2008/0027585 | A1 | 1/2008 | Wesquet et al. |
| 2008/0072878 | A1 | 3/2008 | Kokubu |
| 2009/0005955 | A1 | 1/2009 | Askew |
| 2009/0024299 | A1 | 1/2009 | Wilhelm et al. |
| 2009/0038589 | A1 | 2/2009 | Dingle |
| 2009/0132180 | A1 | 5/2009 | Pearce et al. |
| 2009/0217914 | A1* | 9/2009 | Casasso ............. F02D 41/20 123/490 |
| 2009/0287393 | A1 | 11/2009 | Moller et al. |
| 2010/0275885 | A1 | 11/2010 | Becker et al. |
| 2010/0294242 | A1* | 11/2010 | Kondo ............. F02M 47/027 123/470 |
| 2010/0307457 | A1 | 12/2010 | Sugiyama et al. |
| 2011/0006130 | A1* | 1/2011 | Kondo ............. F02M 47/027 239/71 |
| 2011/0125386 | A1 | 5/2011 | Pursifull |
| 2012/0180762 | A1 | 7/2012 | Casasso |
| 2013/0325301 | A1 | 12/2013 | Gautier et al. |
| 2014/0000564 | A1 | 1/2014 | Shibata et al. |
| 2014/0020661 | A1 | 1/2014 | Nishimura |
| 2014/0043000 | A1 | 2/2014 | Bojarski et al. |
| 2015/0040869 | A1* | 2/2015 | Filippi ............. F02M 65/005 123/472 |
| 2015/0053183 | A1 | 2/2015 | Parrish et al. |
| 2015/0167571 | A1 | 6/2015 | Bartsch et al. |
| 2015/0267660 | A1 | 9/2015 | Nehl et al. |
| 2017/0145975 | A1* | 5/2017 | Majer ............. G01F 22/02 |
| 2018/0156153 | A1 | 6/2018 | Denk |
| 2018/0252752 | A1 | 9/2018 | Shahroudi et al. |

FOREIGN PATENT DOCUMENTS

| | | |
|---|---|---|
| DE | 102015210794 | 7/2016 |
| EP | 1927742 A1 | 6/2008 |
| EP | 2514956 A1 | 10/2012 |
| JP | 2003106200 A | 4/2003 |
| WO | WO9002872 A1 | 3/1990 |
| WO | WO2016091848 A1 | 6/2016 |

OTHER PUBLICATIONS

International Search Report and Written Opinion in International Application No. PCT/US2018/019932, dated Jun. 6, 2018, 10 pages.

Pipitone et al., "Experimental Model-Based Linearization of a S.I. Engine Gas Injector Flow Chart," Journal of Mechanical Engineering, published in 2014, pp. 694-708.

International Preliminary Report on Patentability in International Application No. PCT/US2018/019932, dated Sep. 3, 2019, 7 pages.

\* cited by examiner

FINGERPRINTING OF FLUID INJECTION DEVICES

CROSS-REFERENCE TO RELATED PATENT APPLICATIONS

This application is a continuation of and claims the benefit of priority to U.S. patent application Ser. No. 15/449,514, filed Mar. 3, 2017, the contents of which are incorporated by reference herein.

TECHNICAL FIELD

This instant specification relates to determining the mechatronic response of fluid injectors.

BACKGROUND

Solenoid-operated gas or liquid fluid valves use a form of electromagnetic actuation. These mechanisms generally include a coil and an armature that is free to move and be actuated by magnetic pull generated by the coil when the coil carries an electrical current. The armature is normally spring loaded away from the energized position such that when a power pulse is applied to the coil, the armature is pulled into the energized position and, in moving, opens or closes the valve. In general, once the armature of the solenoid has moved to the end of its operating stroke, no further work is done by the armature.

The solenoid is often combined with a two-position valve, whereby the valve is pulled by the solenoid (when energized) and returned by a spring (when de-energized). The valve attached to the solenoid can be closed in one position and open in a second position, or it can be a changeover valve with two seats. In some applications, such as fuel injectors, it is desirable to measure the timing of the opening and closing positions of the solenoid operated valves for purposes of control and diagnostics.

Diesel and gasoline fuel injectors need to have precise operating times. The valve determines the fuel injection timing. The valve controller also determines the fuel injection duration, which impacts the quantity of fuel injected into a cylinder of a diesel, gasoline, or dual fuel engine. The performance of the engine (balance between cylinders, power, fuel consumption, emissions, and efficiency) is thus affected.

SUMMARY

In general, this document describes systems and techniques for determining the mechatronic response of fluid injectors.

In a first aspect, a computer-implemented method for characterizing a fluid injector includes receiving a collection of data representative of a collection of electrical waveforms, each waveform corresponding to a selected magnitude of electrical excitation provided to an actuator of a fluid injector, identifying a pull locus, based on the collection of data, determining a detection threshold level value, based on the collection of data, identifying a first subset of the collection of data representative of a selected first electrical waveform of the collection of electrical waveforms, based on the detection threshold level value and the collection of data, identifying a representative opening value, based on the collection of data, identifying a representative closing value, based on the representative opening value and the collection of data, identifying an anchor value, based on the collection of data and the first subset, identifying a second subset of the collection of data, representative of a selected second electrical waveform of the collection of electrical waveforms, based on the collection of data, the pull locus, the first subset, and the representative opening value, identifying a maximum electrical value, based on the second subset, identifying an opening locus based the collection of data, the anchor value, and the maximum electrical value, identifying a hold value based on the collection of data, and providing characteristics associated with the fluid injector comprising the pull locus, the opening locus, the hold value, the anchor value, and the representative closing value.

Various implementations can include some, all, or none of the following features. The collection of electrical waveforms can be current waveforms of the fluid injector, the collection of data can be a first collection of fluid injector current measurement values representative of the current waveforms, the pull locus can be a second collection of fluid injector current measurement values, the representative opening value can be a first fluid injector current measurement value, the anchor value can be a second fluid injector current measurement value, the maximum electrical value can be a third fluid injector current measurement value, and the opening locus can be a third collection of fluid injector current measurement values. Identifying a pull locus can include selecting one or more third subsets of the collection of data, each of the selected subsets being representative of a successive pair of the collection of waveforms, each selected pair representing two magnitude-wise successive electrical waveforms, for each of the selected third subsets determining a differential waveform based on a difference between the pair of waveforms, determining that the differential waveform includes a zero crossing point, and identifying and adding a time wise local maxima of the second waveform of the selected pair to a fourth subset of data, and providing the fourth subset as the pull locus associated with the fluid injector. The time wise first local maxima can be the effect of a solenoid armature of the fluid injector starting to move relative to a de-energized state of the fluid injector. Identifying a second subset of the collection of data can include identifying the last value of the pull locus, identifying a subset of the collection of data corresponding to the last value, and providing the identified subset as the second subset. Identifying the anchor value can include selecting one or more third subsets of the collection of data, each of the selected subsets being representative of a successive pair of the collection of waveforms, each selected pair representing two magnitude-wise successive electrical waveforms, for each of the selected third subsets determining a differential waveform based on a difference between the pair of waveforms, determining that the differential waveform is the first differential waveform to include a zero crossing point, and providing the zero crossing point as the anchor value associated with the fluid injector. Identifying the opening locus can include selecting one or more third subsets of the collection of data, each of the selected subsets being representative of a successive pair of the collection of waveforms, each selected pair representing two magnitude-wise successive electrical waveforms of the fluid injector, for each of the selected third subsets determining a differential waveform based on a difference between the pair of waveforms, adding the determined differential waveform to a collection of differential waveform data, identifying the anchor point within the collection of differential waveform data, identifying the maximum electrical value within the collection of differential waveform data, determining a mathematical representation of a line between the anchor value and the maximum electrical value within the collection of differential waveform data, identifying a collection of values within the collection of differential values that intersect the mathematical representation, and providing the identified collection of values as the opening locus associated with the fluid injector. Determining a detection threshold level value can include estimating a nominal noise level of one or more of the collection of electrical waveforms. The method can include actuating a solenoid of the fluid injector with a solenoid actuation waveform based on the representative opening value associated with the fluid injector. Identifying the hold value can include identifying a first stable waveform of the fluid injector that includes values described by the pull locus and satisfies one or more stabilization criteria, determining a minimum electrical value based on the first stable waveform, and providing the minimum electrical value as the hold value associated with the fluid injector.

In a second aspect, a system for characterizing an injector for a fluid injector includes a data processing apparatus and a computer memory storage device storing instructions executable by a computer device and that upon such execution cause the computer device to perform operations including receiving a collection of data representative of a collection of electrical waveforms, each waveform corresponding to a selected magnitude of electrical excitation provided to an actuator of a fluid injector, identifying a pull locus based on the collection of data, determining a detection threshold level value based on the collection of data, identifying a first subset of the collection of data representative of a selected first electrical waveform of the collection of electrical waveforms based on the detection threshold level value and the collection of data, identifying a representative opening value based on the collection of data, identifying a representative closing value based on the representative opening value and the collection of data, identifying an anchor value based on the collection of data and the first subset, identifying a second subset of the collection of data representative of a selected second electrical waveform of the collection of electrical waveforms based on the collection of data, the pull locus, the first subset, and the representative opening value, identifying a maximum electrical value based on the second subset, identifying an opening locus based the collection of data, the anchor value, and the maximum electrical value, identifying a hold value based on the collection of data, and providing characteristics associated with the fluid injector comprising the pull locus, the opening locus, the hold value, the anchor value, and the representative closing value.

Various embodiments can include some, all, or none of the following features. The collection of electrical waveforms can be current waveforms of the fluid injector, the collection of data can be a first collection of fluid injector current measurement values representative of the current waveforms, the pull locus can be a second collection of fluid injector current measurement values, the representative opening value can be a first fluid injector current measurement value, the anchor value can be a second fluid injector current measurement value, the maximum electrical value can be a third fluid injector current measurement value, and the opening locus can be a third collection of fluid injector current measurement values. Identifying a pull locus can include selecting one or more third subsets of the collection of data, each of the selected subsets being representative of a successive pair of the collection of waveforms, each selected pair representing two magnitude-wise successive electrical waveforms, for each of the selected third subsets determining a differential waveform based on a difference between the pair of waveforms, determining that the differential waveform includes a zero crossing point, and identifying and adding a time wise local maxima of the second waveform of the selected pair to a fourth subset of data, and providing the fourth subset as the pull locus associated with the fluid injector. The time wise first local maxima can be the effect of a solenoid armature of the fluid injector starting to move relative to a de-energized state of the fluid injector. Identifying a second subset of the collection of data can include identifying the last value of the pull locus, identifying a subset of the collection of data corresponding to the last value, and providing the identified subset as the second subset. Identifying the anchor value can include selecting one or more third subsets of the collection of data, each of the selected subsets being representative of a successive pair of the collection of waveforms, each selected pair representing two magnitude-wise successive electrical waveforms, for each of the selected third subsets determining a differential waveform based on a difference between the pair of waveforms, determining that the differential waveform is the first differential waveform to include a zero crossing point, and provide the zero crossing point as the anchor value associated with the fluid injector. Identifying the opening locus can include selecting one or more third subsets of the collection of data, each of the selected subsets being representative of a successive pair of the collection of waveforms, each selected pair representing two magnitude-wise successive electrical waveforms of the fluid injector, for each of the selected third subsets determining a differential waveform based on a difference between the pair of waveforms, adding the determined differential waveform to a collection of differential waveform data, identifying the anchor point within the collection of differential waveform data, identifying the maximum electrical value within the collection of differential waveform data, determining a mathematical representation of a line between the anchor value and the maximum electrical value within the collection of differential waveform data, identifying a collection of values within the collection of differential values that intersect the mathematical representation, and providing the identified collection of values as the opening locus associated with the fluid injector. Determining a detection threshold level value can include estimating a nominal noise level of one or more of the collection of electrical waveforms. The system can include actuating a solenoid of the fluid injector with a solenoid actuation waveform based on the representative opening value associated with the fluid injector. Identifying the hold value can include identifying a first stable waveform of the fluid injector that includes values described by the pull locus and satisfies one or more stabilization criteria, determining a minimum electrical value based on the first stable waveform, and providing the minimum electrical value as the hold value associated with the fluid injector.

The systems and techniques described herein may provide one or more of the following advantages. First, a system can characterize the mechanical motion of the armature component (e.g., a valve) of injectors to enable monitoring, diagnostics, and prognostics of such injectors. Second, the system can provide non-intrusive adaptive (e.g., dynamic) fuel control as an injector or other electromagnetic actuator ages. Third, the system can enable automated calibration of injectors or valves on an engine. Fourth, the system can enable cylinder balancing and detect imbalances in any injector. Fifth, the system can determine information for use in the diagnosis of inaccurate fueling such as spring failures, sticky valves, valve wear, loose electrical connectors and incorrect control settings. Sixth, the system can determine information that can be used in a process to protect an engine from injector related failures and resist control run-offs, wandering, and other instabilities. Seventh, the system can determine bounce metrics, such as how long an injector armature bounced, time of the first bounce, and armature settling time.

The details of one or more implementations are set forth in the accompanying drawings and the description below. Other features and advantages will be apparent from the description and drawings, and from the claims.

DETAILED DESCRIPTION

Figure 1:
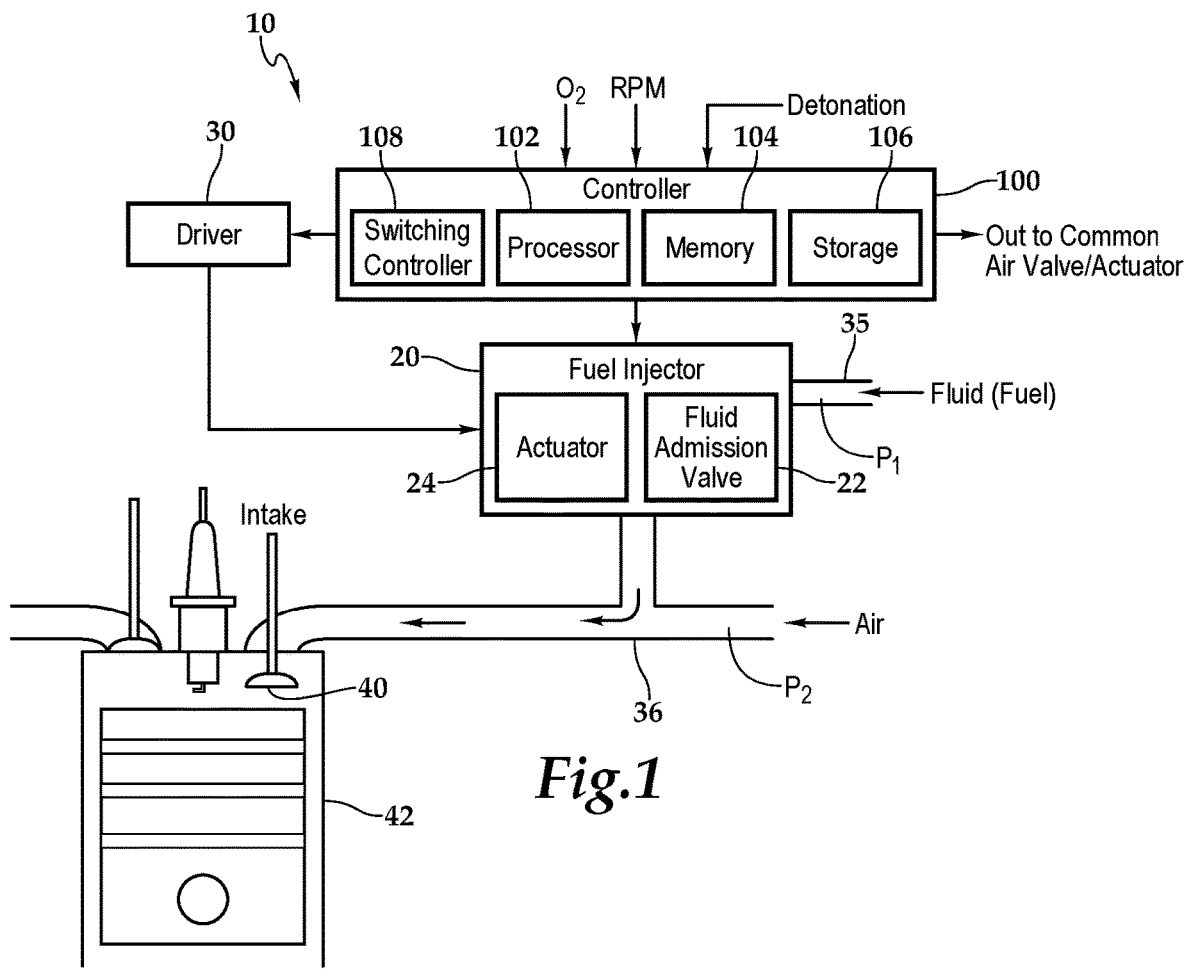
FIG. 1 is a schematic diagram that shows an example fluid admission system for a reciprocating engine.

This document describes systems and techniques for determining individual fluid (e.g., fuel) injector mechatronic response maps, hereafter called the "fingerprints" of the injectors. Fluid injectors are typically comprised of an electromagnetic actuator plus a mechanical fluid admission valve whose position controls the amount of fluid (e.g., fuel) injected (e.g., into the intake of, or directly into, the combustion chamber of an engine). In modern embodiments an injector may include pressure regulation and direct delivery into the combustion chamber. In applications in which the fluid delivery response of a fluid injector is being determined, the "fingerprint" is a representation of the mechatronic response of the overall fluid injector. Such fingerprints are representative of the unique electromagnetic and mechanical characteristics of a combination of the valve, the actuator used to drive the valve, the internal volumes of the system, the geometry of the ports, the geometry of the passages, other geometrical features, or combinations of these any other appropriate variables that can determine the dynamics of fluid delivery, from injector supply to injector delivery. For the purposes of this document, the term "injector" includes any mechatronic fluid control device such as a fuel injector or a fluid injector.

In general, to meet stringent emissions and efficiency requirements, engine controllers are designed to deliver precise amounts of fuel to each of a one or more cylinders of a reciprocating engine at precise times within the combustion cycle. This is generally done by adjusting the start and duration of the current waveform that actuates a solenoid-operated fuel injector valve. The valve could be a single stage or part of a multi-staged electro-hydraulic or electro-pneumatic injection system. For example, in common-rail diesel applications, the valve can actuate a second hydraulic stage (e.g., nozzle) injector or pump.

Similar to the ways in which the minutia of human fingerprints can be analyzed to produce a mathematical representation that uniquely identifies individual persons, mechatronic fluid system components such as solenoid-operated fluid injectors can exhibit unique performance characteristics that can be analyzed to identify a characteristic map, or "fingerprint", that can uniquely characterize their operational and dynamic behavior. The fingerprint of an injector may change over time through use due to, for example, aging or fouling. Fingerprints can be re-determined over time and compared to identify, characterize, and/or diagnose changes in actuator behavior. For example, a fuel injector can be fingerprinted when it is new, and be fingerprinted again after a period of use (e.g., a service interval), and the latter fingerprint can be compared to the former in order to quickly and easily determine if the operational behavior of the injector has changed. Fingerprint information can also be used as indicators of the causes of such behavioral changes, as a tool to determine whether injector service (e.g., repair or replacement) is needed, as a tool to predict an estimated time until service will be needed, as an input to an injector tuning or calibration process, or any other appropriate process that can be performed based on fuel injector operational characteristics.

In general, a fluid injector is energized with a collection of actuation waveforms having different energy levels (e.g., a collection of different currents or a collection of different voltages). In this document, an individual actuation based on a selected energy level is referred to as a "shot" or "run". The power consumption of the actuator is measured during each shot to identify a collection of corresponding feedback waveforms. The collection of feedback is analyzed to identify several predetermined subsets of data and/or features that are representative of several corresponding operational characteristics. Examples of such features and means of identifying them will be discussed in more detail below. Collectively, these features summarize selected operational characteristics of the actuator for use in further analyses or operations. For the purposes of the descriptions discussed in this document, the concepts of "data" and a "collection of data" are synonymous.

FIG. 1 is a schematic diagram that shows an example fluid (e.g., fuel) admission system 100 for a reciprocating engine. In some implementations, the system 10 can be used for determining the response behavior of an injector, such as a solenoid-operated fluid injector 20. An actuator controller 100, such as an Engine Control Module (ECM), is a hysteretic current or voltage controller used to control actuation of the injector 20 and measure the injector's behavior in response to being actuated in order to determine an injector fingerprint. By determining an injector fingerprint, the controller 100 can monitor, diagnose, and/or predict the mechanical motion of the armature component (e.g., valve) of the fluid injector 20.

The fluid injector 20 of example fluid admission system 100 is a solenoid valve that includes a valve 22 (e.g., a needle valve) that is moveable between a first configuration in which the valve 22 is at a mechanical "closed" position, and a second configuration in which the valve 22 is at a mechanical "open" position. The valve 22 is driven by an actuator 24 (e.g., solenoid) having a stator, solenoid coil, return spring, and armature. At rest, the spring urges the valve 22 toward the "closed" position, thereby blocking the flow of a pressurized fluid (e.g., fuel) from a fluid passage 35 (e.g., a fuel gallery) to a fluid nozzle. The fluid injector 20 operates when a current is applied to the actuator 24 from the controller 100, pulling the armature with enough force to overcome the bias of the spring and moving the valve 22 toward the "open" position, thus allowing pressurized fluid to flow from the fluid passage 35 to intake path 36 and on to an intake valve 40 of a combustion chamber 42.

The controller 100 provides the control signals (e.g., current) that energize the solenoid coil, which in turn causes the injector 20 to open. The controller 100 also monitors the control signals (e.g., current consumption, back EMF) to determine when and how the valve of the injector 20 moves during actuation. Generally speaking, by determining the operational behavior of the injector 20 under various actuation stimuli, the controller 100 can determine how it may reduce current to the solenoid coil of the injector 20 (e.g., to conserve power), and/or determine the amount of time the valve 22 took to move from the "closed" position to the "open" position (e.g., to calibrate valve timing, diagnose malfunctions, predict malfunctions).

The controller 100 can be used for the operations described herein according to one implementation. The controller 100 includes a processor 102, a memory 104, a storage device 106, and switching controller 108. The processor 102 is capable of processing instructions for execution within the system 100. In one implementation, the processor 102 can be a field-programmable gate array (FPGA) processor. For example, with the advent of very fast FPGAs, it is possible to look carefully at the switching controller 108 logic and detect very small variations in current and voltage waveforms at very fast clock rates.

In another implementation, the processor 102 can be a single-threaded processor. In another implementation, the processor 102 can be a multi-threaded processor. In some implementations, the processor 102 can be capable of processing instructions stored in the memory 104 or on the storage device 106 to collect information from, and provide control signals to, the fluid injector 20.

The memory 104 stores information within the controller 100. In some implementations, the memory 104 can be a computer-readable medium. In some implementations, the memory 104 can be a volatile memory unit. In some implementations, the memory 104 can be a non-volatile memory unit.

The storage device 106 is capable of providing mass storage for the system 100. In one implementation, the storage device 106 is a computer-readable medium. In various different implementations, the storage device 106 may be non-volatile information storage unit (e.g., FLASH memory).

The switching controller 108 provides control signal output operations for the controller 100. The switching controller 108 provides actuation control signals (e.g., pulse width modulated, PWM, driver signals) to a driver 30 which drives the actuator 24. For example, the switching controller 108 can include field effect transistors (FETs) or other switching devices that can convert a logic-level signal from the processor 102 to a current and/or voltage waveform with sufficient power to drive the solenoid coil of the actuator 24. In another implementation, the switching controller 108 receives feedback signals from the fluid injector 20, such as impedance values (L, R), rise time constants (L/R), and back-propagated electromagnetic force signals (e.g., back-EMF).

The features described herein can be implemented in digital electronic circuitry, or in computer hardware, firmware, software, or in combinations of them. The apparatus can be implemented in a computer program product tangibly embodied in an information carrier, e.g., in a machine-readable storage device for execution by a programmable processor; and method steps can be performed by a programmable processor executing a program of instructions to perform functions of the described implementations by operating on input data and generating output. The described features can be implemented advantageously in one or more computer programs that are executable on a programmable system including at least one programmable processor coupled to receive data and instructions from, and to transmit data and instructions to, a data storage system, at least one input device, and at least one output device. A computer program is a set of instructions that can be used, directly or indirectly, in a computer to perform a certain activity or bring about a certain result. A computer program can be written in any form of programming language, including compiled or interpreted languages, and it can be deployed in any form, including as a stand-alone program or as a module, component, subroutine, or other unit suitable for use in a computing environment.

Suitable processors for the execution of a program of instructions include, by way of example, both general and special purpose microprocessors, and the sole processor or one of multiple processors of any kind of computer. Generally, a processor will receive instructions and data from a read-only memory or a random access memory or both. The essential elements of a computer are a processor for executing instructions and one or more memories for storing instructions and data. Generally, a computer will also include, or be operatively coupled to communicate with, one or more mass storage devices for storing data files; such devices include magnetic disks, such as internal hard disks and removable disks; magneto-optical disks; and optical disks. Storage devices suitable for tangibly embodying computer program instructions and data include all forms of non-volatile memory, including by way of example semiconductor memory devices, such as EPROM, EEPROM, and flash memory devices; magnetic disks such as internal hard disks and removable disks; magneto-optical disks; and CD-ROM and DVD-ROM disks. The processor and the memory can be supplemented by, or incorporated in, ASICs (application-specific integrated circuits).

In some implementations, this detection, along with valve close time data can be used to calibrate and compensate the timing of the fluid injector 20 actuation to improve the precision and/or repeatability of fluid delivery. In some implementations, the determination injector dynamic operational characteristics can enable non-intrusive, adaptive (e.g., dynamic) fluid trimming as the fluid injector 20 ages. In some implementations, operational characteristics detection can be used to reduce electrical current in the later stages of the driving waveform used to actuate the fluid injector 20, which in some applications can be done to reduce power consumption, increase service life, and/or reduce the cost of the fluid injector 20 and/or the controller 10.

Figure 2:
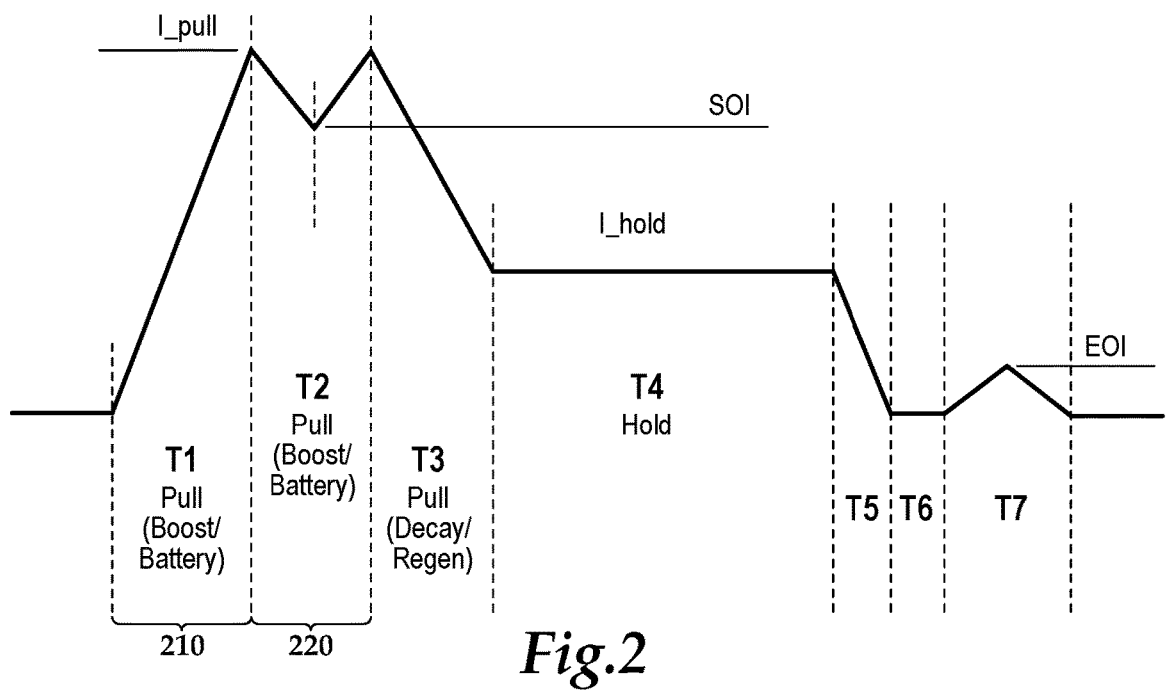
FIG. 2 is a chart of an example current waveform of a fluid injector.

FIG. 2 is a chart of an example current waveform 200 of an injector. In some implementations, the current waveform 200 can represent the current observed as the example controller 100 of FIG. 1 causes the valve 22 of the example fluid injector 20 to open.

In general, the controller 100 defines current profiles for actuation by subdividing a substantially whole current profile into multiple segments. In some implementations, each segment can be configured with a set of parameters that define the control scheme for FET bridge circuitry. In some implementations, each segment can be configured to analyze high and/or low side comparator (HSC/LSC) switching. In some implementations, signal filtering may be done in the FPGA to reduce FET related noise before the segmentation is performed.

The current waveform 200 represents the current observed as an injector is actuated, for example, as the valve 20 of the fluid injector 20 opened. The current waveform 200 includes a number of segments that represent various phases of actuation.

During a pull-in phase 210, current is increased to increase the strength of the magnetic field acting upon an armature (e.g., the valve 22). As the strength of the field increases, at some point the armature will start to move from its seat (e.g., the "closed" position) and accelerate until it reaches its stop (e.g., the "open" position).

During a hysteretic control phase 220, the current waveform 200 oscillates in response to the armature hitting a hard stop (e.g., the valve 22 reaches the "open" position). During the hysteretic control phase 220, the current waveform 200 rises and falls. The rise and fall times of the coil current can be explained by the following equation:

$$\frac{dI}{dt} = \frac{(V - EMF_b - IR)}{L}$$

Where:

L is coil inductance (Henries), which is a function of coil current I (Amps) and armature position x (meters).

V is the voltage (volts) supplied during the phase.

$EMF_b$ is the back EMF (volts).

R is the coil resistance (ohms).

The voltage can be a boosted or battery voltage, but typically 24V battery voltage is used for common rail applications. $EMF_b$ refers to the back-electromotive forces generated during the armature motion and it opposes the driving voltage during the pull-in phase. Once the armature hits a hard stop, such as at the "open" position, the $EMF_b$ abruptly drops to substantially zero and this can be detected by monitoring at the current and FET comparator waveforms. Under the hysteretic current control described herein, the FET comparator duty cycles are monitored to determine when the valve 22 has reached the "open" position. The time at which the valve 22 reaches the "open" position is considered to be the valve open time (VOT).

The hysteretic control phase 220 can be partitioned into two intervals—before and after the valve 22 hits the stop at the "open" position. Before the valve 22 hits the stop, the $EMF_b$ is very large and abruptly drops to substantially zero once the valve 22 hits the stop. From the equation above, the current slew rates are primarily controlled by the $EMF_b$. Inductance (L), resistance (IR) and voltage (V) can be approximated as constant. Under such circumstances, the pulse width modulation (PWM) duty cycles of the switching controller 108 (e.g., FET comparators) can level off after the valve 22 hits the stop. In use, hysteretic control actually has a fast (e.g., 10 microsecond) loop rate in which many more divisions and interesting/useful current control shapes are possible within the T2. For example, the hysteretic control can be driven such that a detectable, sharp minimum or a detectable high signal to noise feature is created at first impact.

The EMF is explained by the principles of Faraday's law of electromagnetic induction, which is the production of an electromotive force or voltage across an electrical conductor due to its dynamic interaction with a magnetic field. Lenz's law describes the direction of the induced field. The is explained by Lenz's law and the principles of Faraday's law of electromagnetic induction, given by the equation:

$$\varepsilon = -\frac{\partial \Phi}{\partial t}$$

which indicates that the induced voltage ($\varepsilon$) opposes the change in magnetic flux ($\phi$). Lenz's law explains the back EMF (BEMF) generated as the armature moves in a magnetic field. The BEMF increases proportionally with the velocity of the armature, and goes to zero when the armature stops moving.

Figure 3:
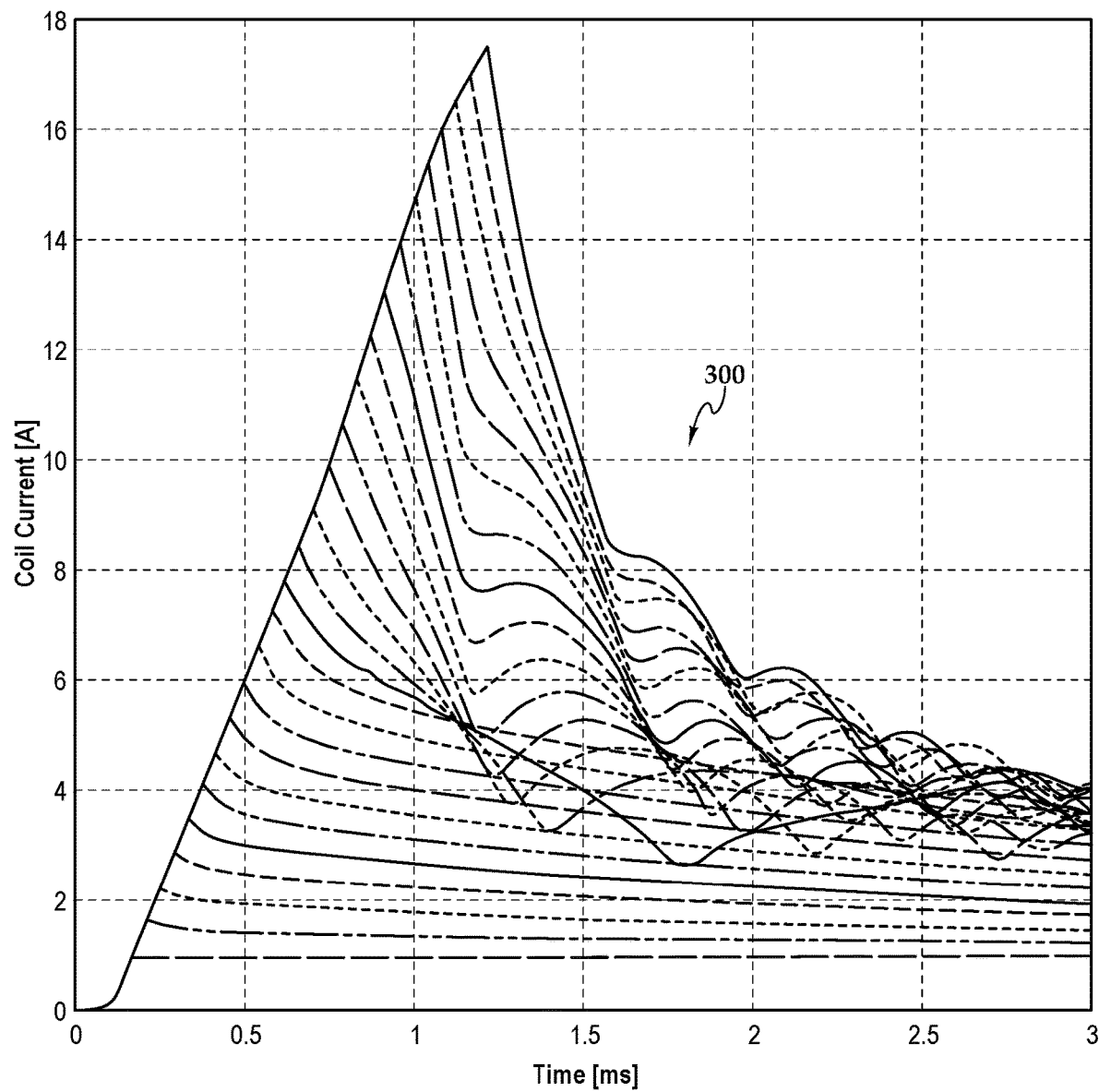
FIG. 3 is a chart of an example collection of current waveforms of a fluid injector.

FIG. 3 is a chart of an example collection of current waveforms 300 of a fluid injector 20. Each of the current waveforms 300 represents the current observed for a separate shot (e.g., run, actuation) as the example controller 100 of FIG. 1 causes the valve 22 of the example fluid injector 20 to open in response to a different actuation current level. Although the examples discussed in this document generally describe current waveforms that result from various applied actuation currents (e.g., to drive solenoid-type actuators), in some embodiments similar techniques can be used to characterize other types of actuators (e.g., piezo actuators) based on a collection of voltage waveforms that result from the application of various actuation voltages.

Figure 4:
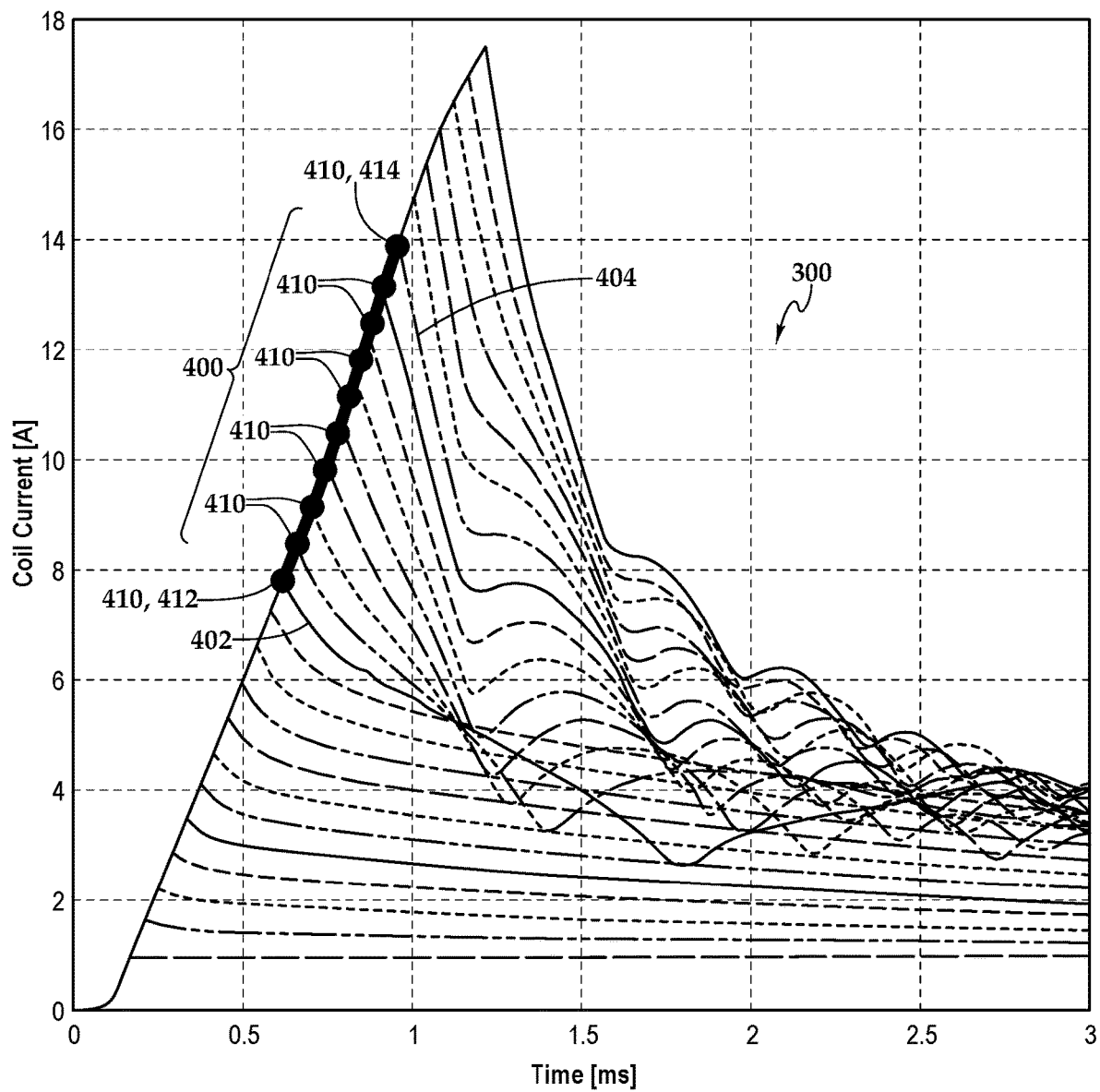
FIGS. 4 and 5 are charts of an example pull locus.
Figure 5:
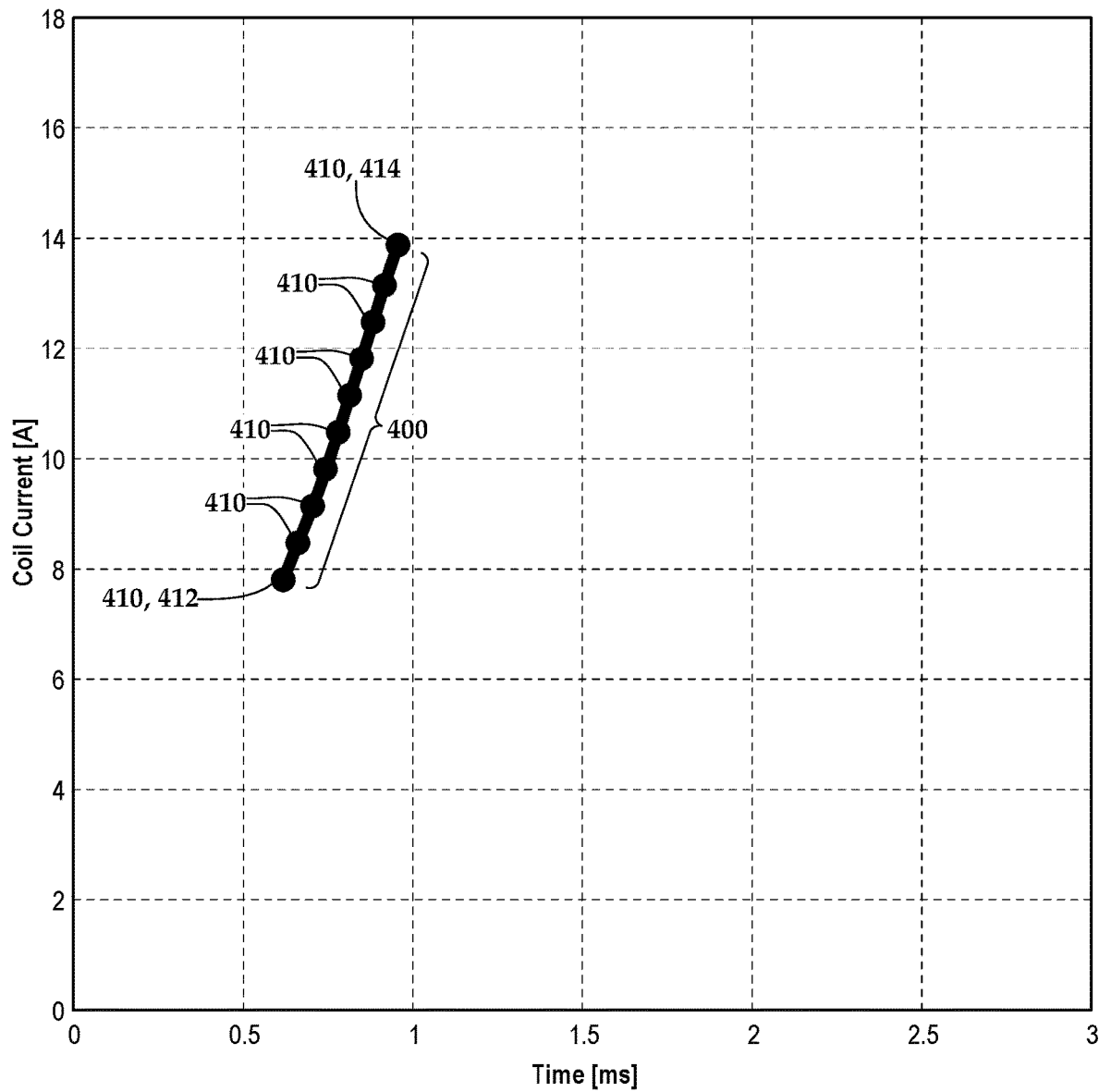

FIGS. 4 and 5 are charts of an example pull locus 400. FIG. 4 shows the pull locus 400 overlaid upon the collection of current waveforms 300, whereas FIG. 5 shows the pull locus alone (e.g., as a subcomponent of an actuator fingerprint).

In controls and signal processing applications, noise, interference and electromagnetic induced radiation and distortion is a potential barrier in signal pattern detection and diagnostics. Therefore, estimating and countering noise can be implemented to improve the signal-to-noise ratio needed for automated fingerprinting processes like the process described herein.

In this step of the process, the nominal noise level of the current waveforms is estimated. In some implementations, the best place to perform such detection is during the initial few shots at the beginning and end of the process. In some implementations, a predetermined number of samples can be evaluated to get a good statistical measure. Noise spikes and ringing can be filtered out to improve signal-to-noise while taking care such that actual signal artifacts like armature bouncing are not affected by filtering. In some implementations, if excessive noise is detected, then the automated process can be repeated, and if noise persists then a diagnostic warning can be sent to a user and the fingerprinting process may be aborted. In some implementations, additional noise abatement steps like shielding, grounding, etc., can also be taken.

The signal-to-noise, once found acceptable, is then used to create thresholds and scaling for the forthcoming steps. A sensory threshold is first calculated which is the weakest signal that the process can detect as true signal. The detection threshold level is a recognition threshold that is a factor, typically 2-6 times the sensory threshold. The process can determine the factor depending on the noise estimated. This detection threshold can be used to quantify the ability to discern the information bearing pattern in the signal from random noise that can distort the information.

The pull locus 400 includes a collection of Start-of-Injection (SOI) points 410. For each of the waveforms 300, the SOI point 410 (e.g., closure point, Valve Opening Time, VOT) coincides with the BEMF of the corresponding waveform 300 abruptly dropping to zero. In some implementations, this behavior can be monitored by looking at the minima of the current waveform during the hysteretic control phase 220 (e.g., T2, Pull-Hold period) or from the duty cycle of the switching controller 108.

Figure 7:
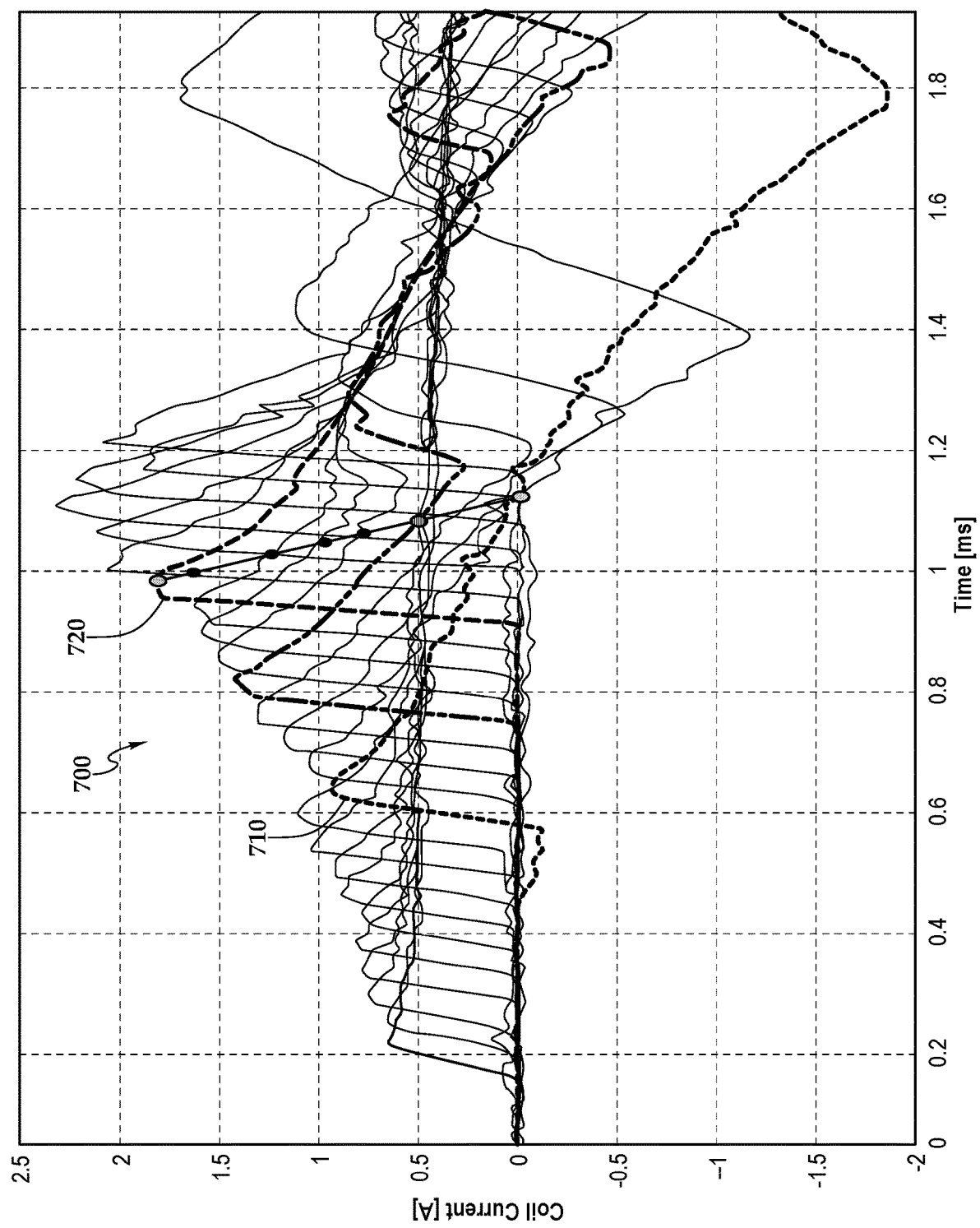
FIGS. 7 and 8 are charts of an example collection of differential waveforms.
Figure 8:
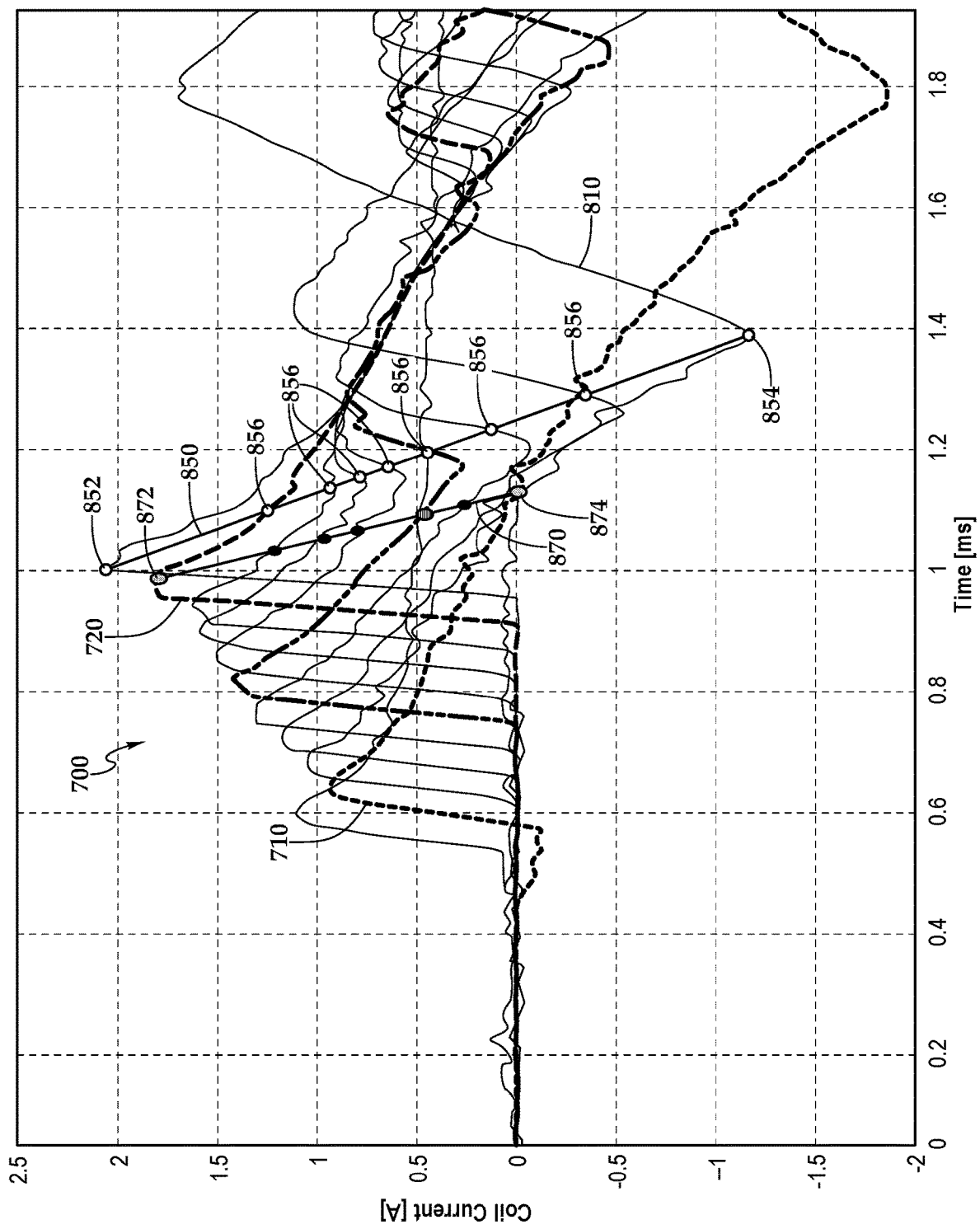

Referring briefly to FIGS. 7 and 8, each injection shot is compared to its stepwise neighboring shot. This is done by identifying, for each point in one of the waveforms 300, the current value of a time wise corresponding point in another waveform (e.g., generally the lesser neighboring waveform) to form a differential waveform 700. FIGS. 7 and 8 show a collection and subset of such differential waveforms that were determined from the collection of current waveforms 300.

Still referring to FIGS. 7 and 8, during the pull locus identification stage, the first injection shot where there is a big change in the current waveform from its stepwise neighboring shot is detected. In some implementations, the minimum spacing between the two neighboring waveforms can be based on the signal-to-noise ratio. This first big change is exhibited by a differential waveform 710.

Referring back to FIG. 4, the greater current waveform 300 from which the differential waveform 710 is determined is identified as a minimum pull current waveform 402. The pull current of this shot corresponds to the condition where the valve 22 moves and just barely reaches the stop position before returning to the seat (e.g., closed position). The SOI point that corresponds to the waveform 402 is identified as point 412. The point 412 represents the approximate minimum pull current required to see any meaningful build-up in the magnetic field to create armature motion and, thereby, fluid flow. The point 412 also represents the first (e.g., starting) value of the pull locus 400.

As the current is increased in subsequent shots, the SOI happens earlier as a stronger magnetic field is created more rapidly, causing valve 22 to accelerate to the stop more quickly. For each step increase in current, as represented by the waveforms 300, the point 410 corresponding to the SOI for each waveform 300 is identified and stored. A locus of the SOIs is created, which is the pull locus 400 (e.g., pull current locus).

Increasing the pull currents beyond a particular point does not hasten the valve opening time, and can contribute to Joule or resistive heating. The amount of heat released is proportional to the square of the current, $I^2$, and coil resistance, R. Moreover, in some examples, the opening can happen even before the pull current is realized. The pull current beyond which there is no impact on the opening time is identified as the maximum pull current. Referring to FIGS. 7 and 8, the differential waveform 700 that exhibits this behavior is identified as a differential waveform 720. Referring back to FIG. 4, the greater current waveform 300 from which the differential waveform 720 is determined is identified as a maximum pull current waveform 404. Referring to FIGS. 4 and 5, the SOI of the maximum pull current waveform 404 is identified as point 414. The point 414 also represents the last (e.g., ending) value of the pull locus 400.

Figure 6:
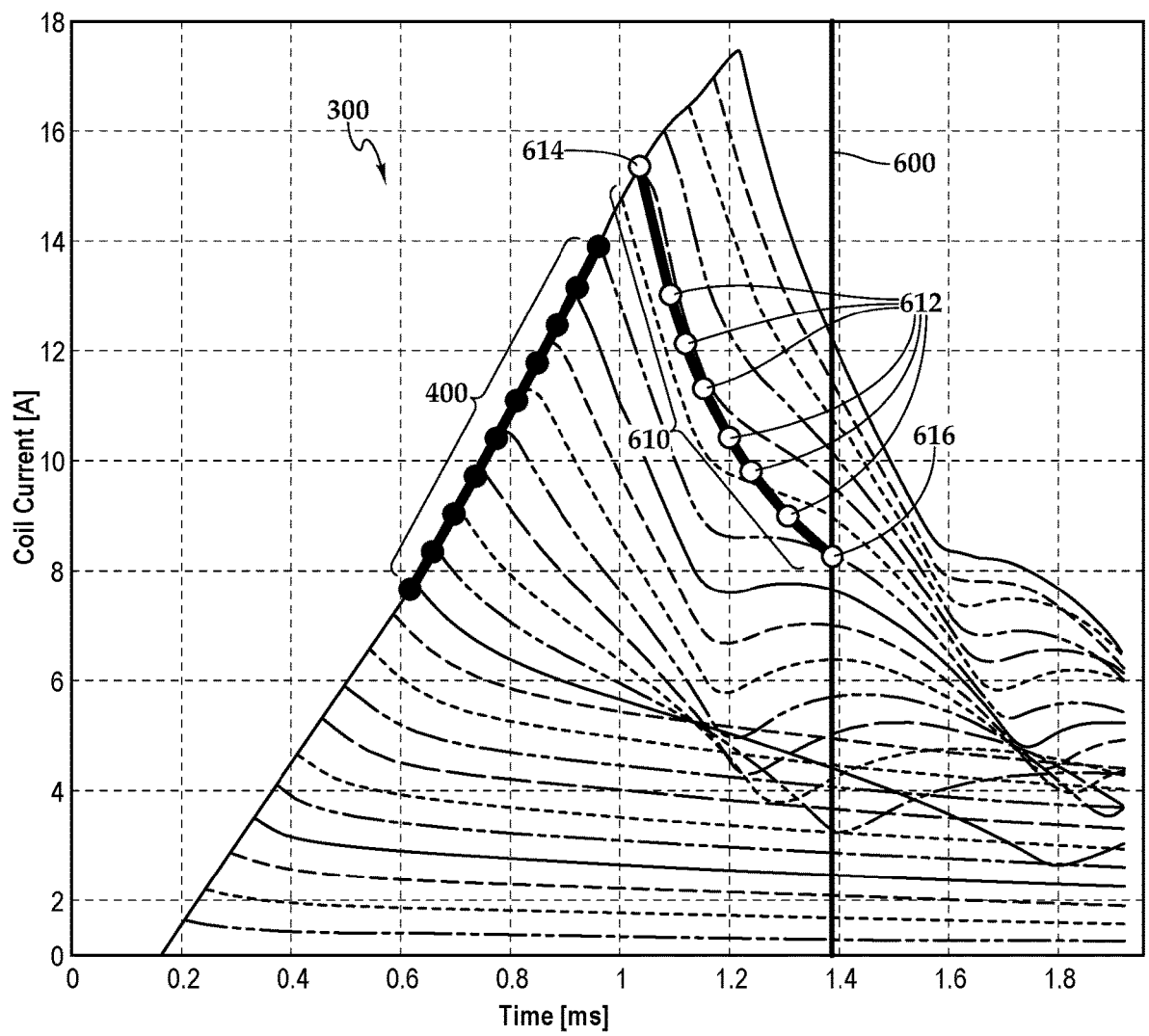
FIG. 6 is a chart of an example right margin and an example right margin locus.

FIG. 6 is a chart of an example right margin 600 and an example right margin locus 610. Generally speaking, increasing the pull current beyond a particular point does not hasten the valve opening time and can contribute to Joule or resistive heating. Similarly, holding the pull current for any longer than needed to stabilize the armature at the stop is unnecessary and can have a negative effect upon coil and driver (e.g., ECU) longevity and power efficiency.

The points that contribute to the right margin locus 610 (e.g., pull hold current) is identified for every right margin point 612, and the right margin locus 610 is identified as a representation of valve open stability criteria. The pull locus 400 and right margin locus 610 represent the limits of optimal control of the injector opening.

To provide a better conceptual example of how the right margin locus 610 is identified, we refer again to FIG. 8 which includes a right margin locus 850. As discussed previously, the differential waveform 710 was identified in association with the minimum pull current waveform 402, and the differential waveform 720 was identified in association with the maximum pull current waveform 404. For the determination of the right margin locus 750, a second pair of differential waveforms is identified.

An upper point 852 is identified by locating a differential waveform 820. The differential waveform 820 is identified as being the next sequentially adjacent differential waveform following the differential waveform 720. The peak value of the differential waveform 820 is taken as the upper point 852.

A lower point 854 is identified by locating a differential waveform 810. The differential waveform 810 is identified as being the next sequentially adjacent differential waveform following the differential waveform 710. The minimum value of the differential waveform 810 is taken as the lower point 854.

An interpolation is performed between the upper point 852 and the lower point 854, represented by the straight line in the illustration of the right margin locus 850. The line intercepts several of the differential waveforms, and each of these intercept points is taken as an intermediate point 856. The collection of intermediate point 856, the upper point 852, and the lower point 854, is taken as the right margin locus 850 in the differential domain.

With reference to FIG. 6, the right margin locus 850 is mapped back to the current/time domain as the right margin locus 610. The current/time coordinate for each of the intermediate point 856 is mapped onto the collection of current waveforms 300 to identify a corresponding right margin point 612. The current/time coordinate for the upper point 852 is mapped onto the collection of current waveforms 300 to identify a corresponding right margin point 614, and the current/time coordinate the lower point 854 is mapped onto the collection of current waveforms 300 to identify a corresponding right margin point 616 (e.g., right margin anchor). Together, the right margin points 612, 614, and 616 define the right margin locus 610. The current level associated with the right margin point 614 also represents a maximum pull current, above which no further actuation performance benefits may be exhibited by the actuator, although the current may be allowed to temporarily increase above this level temporarily.

The right margin 600 is identified based on the right margin point 616. In some implementations, however, the right margin 600 may be determined based on other factors. For example, the right margin 600 may be a predetermined value based on known values, such as design parameters or right margin values that were previously empirically determined for a population of other similar (e.g., same make and model) fluid injectors.

Referring once again to FIG. 8, the process for identifying an example opening locus 870 will be discussed. Although the first opening run detects the first valve armature movement that leads to a result in a small change in current, the armature closure or valve opening is not considered to have occurred until the armature has completely reached the stop completely and stabilized without returning to the seat. This often is followed by many bounces before it stabilizes.

The injection shot that results in the substantially stabilized opening of the fluid injector is called opening run or shot. During this shot, the armature is accelerating and stops suddenly at the stop, and by Lenz's law explained above, the stoppage creates a large BEMF change that can be detected.

In the example of FIG. 8, the peak value of the differential waveform 720 is identified as an upper opening point 872. To determine a lower opening point 874, the differential waveform 710 is analyzed to determine a zero-crossing point (e.g., where the differential value equals zero). An interpolation is performed between the upper opening point 872 and the lower opening point 874, as represented by the line of the opening locus 870. The interpolation intercepts multiple intermediate differential waveforms in the collection 700, and each of these intercept points is identified as an intermediate opening point 876.

Figure 9:
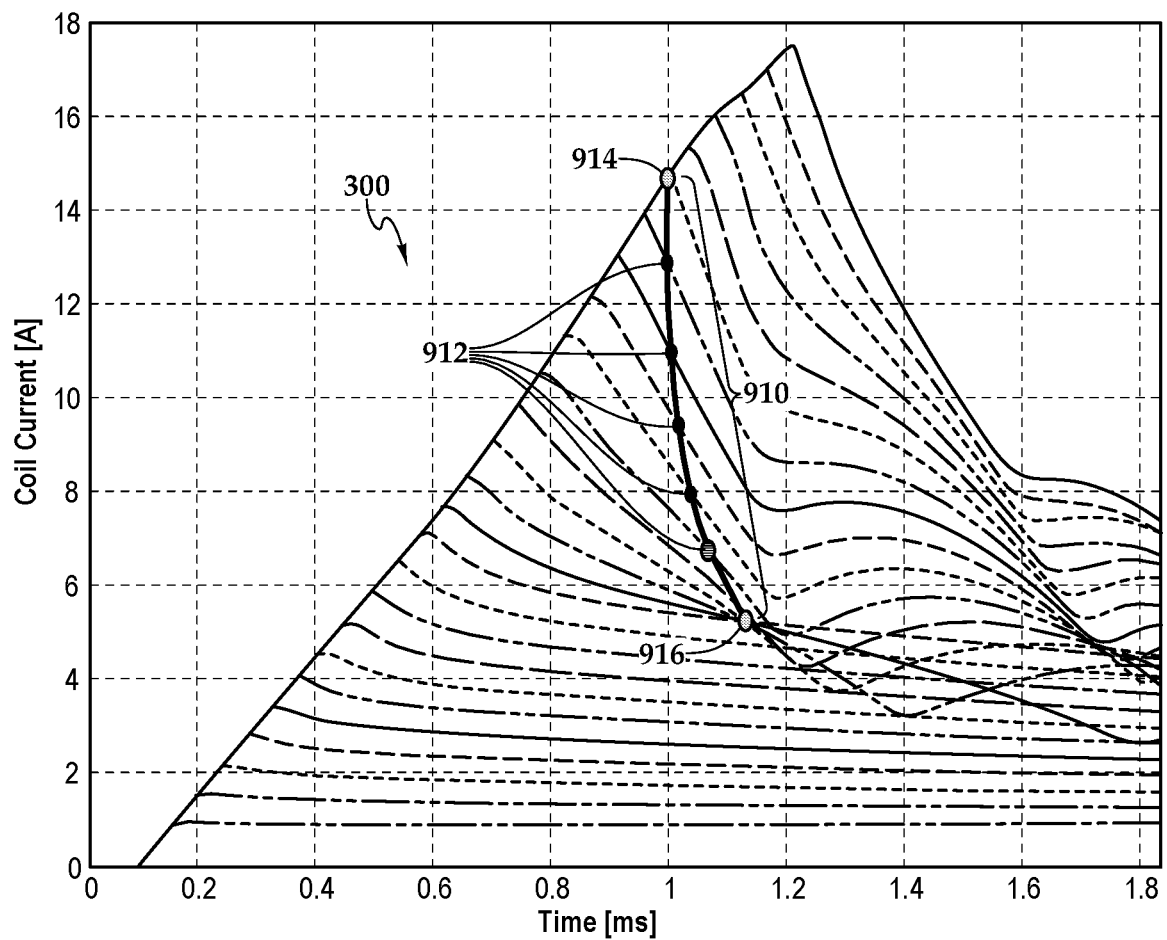
FIG. 9 is a chart showing the example collection of waveforms and the example opening locus.

FIG. 9 is a chart showing the example collection of waveforms 300 and an example opening locus 910. The opening locus 870 is mapped back to the current/time domain as the opening locus 910. The current/time coordinate for each of the intermediate opening point 876 is mapped onto the collection of current waveforms 300 to identify a corresponding opening point 912. The current/time coordinate for the upper opening point 872 is mapped onto the collection of current waveforms 300 to identify a corresponding opening point 914, and the current/time coordinate the lower opening point 874 is mapped onto the collection of current waveforms 300 to identify a corresponding opening point 916. Together, the opening point 912, 914, and 916 define the opening locus 910.

As pull in current is increased, one can see that several of the subsequent waveforms cross at a point which will be referred as the anchor point, which represents an ideal time to valve opening. In the current example, the lower opening point 916 is used to identify the anchor point. In some implementations, other techniques may be used to identify the anchor point. For example, the collection of waveforms 300 may be analyzed directly to determine the coordinates where the waveforms 300 may cross. The locations of these crossing points may be mathematically combined to determine a centroid (e.g., average or mean crossing point), and the coordinates of the centroid can be identified as the anchor point or anchor value.

Figure 10:
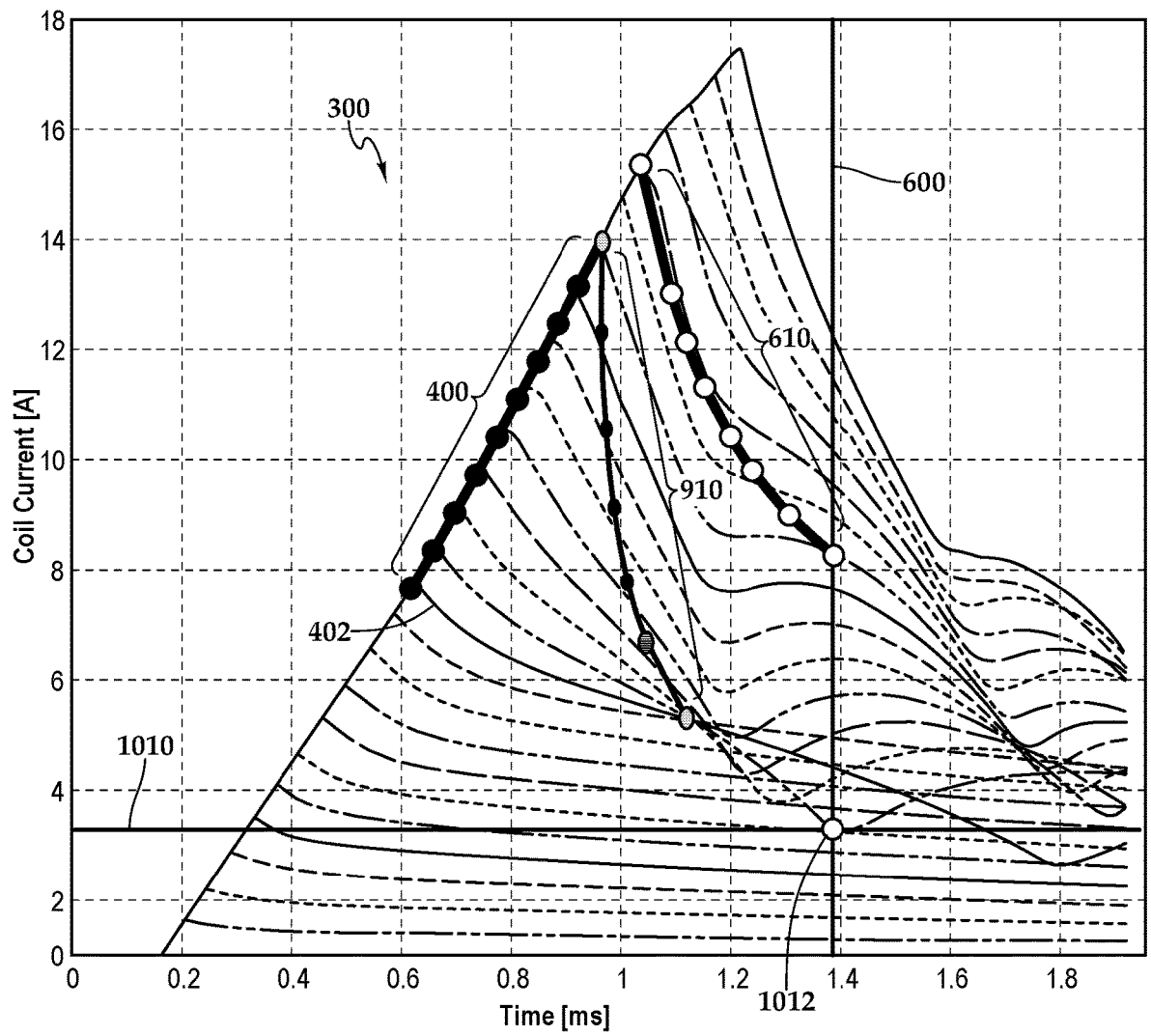
FIG. 10 is a chart showing the example collection of waveforms, pull locus, right margin, right margin locus, current hold value, and an example opening locus.

FIG. 10 is a chart showing the example collection of waveforms 300, the example pull locus 400, the example right margin 600, the example right margin locus 610, the example opening locus 910, and an example current hold value 1010.

For a given electromagnetic actuator or fluid injector, a particular amount of power is needed in order to get the armature (e.g., valve needle) to start moving, as represented by the pull locus 400. For a given actuator or fluid injector, a particular amount of power is also needed in order to get the armature to fully open, as represented by the opening locus 910. Similarly, for a given actuator or fluid injector, once the armature is fully open, a particular (e.g., generally lesser) minimum amount of power can be used in order to keep the armature fully open. This amount of power is referred to as a minimum hold current 1010.

In some implementations, the coil current measured in amps can be representative of the magnetic force (e.g., $I_{coil}(A) \times K_t(N/A) = $ force (N)). For example, information about force can provide insight into the motion of the armature and/or what is holding the armature at the stop. Together with the coil voltage, the coil current can also representative of power (e.g., in steady state, $V_{coil}(V) \times I_{coil}(A) =$ power (W)). For example, information about power can be used to identify parameters for the power supply, driver circuitry, coil design (e.g., temperature limits), and other appropriate power-related parameters. In another example, the driver delivers power but it is the force that causes the armature to move. If the valve becomes stuck, the driver can still deliver the same power but the armature and valve may not move, and by determining both force and power, a stuck condition can be detected.

Referring back to FIG. 8 again, the minimum hold current 1010 is determined from the collection of differential waveforms 700. As was discussed above, the minimum value of the differential waveform 810 was taken as the lower point 854. The lower point 854 is interpreted as also representing the time when the minimum hold current 1010 is achieved. In the illustrated example, the lower point 854 occurs at approximately 1.38 ms.

Referring now to FIG. 10, the minimum pull current waveform 402 is analyzed to identify the amount of current passing through the electromagnetic actuator of the fluid injector at the time of the lower point 854. The amount of current exhibited by the minimum pull current waveform 402 at the time of the lower point 854 is identified as the minimum hold current 1010. In the illustrated example, the lower point 854 occurred at approximately 1.38 ms, and the minimum pull current waveform 402 reaches 1.38 ms at an intercept point 1012. In the present example, the intercept point 1012 occurs at a current level of approximately 3.5 A. As such, in the current example the minimum hold current 1010 is identified as the determined 3.5 A current level identified at the intercept point 1012.

Figure 11:
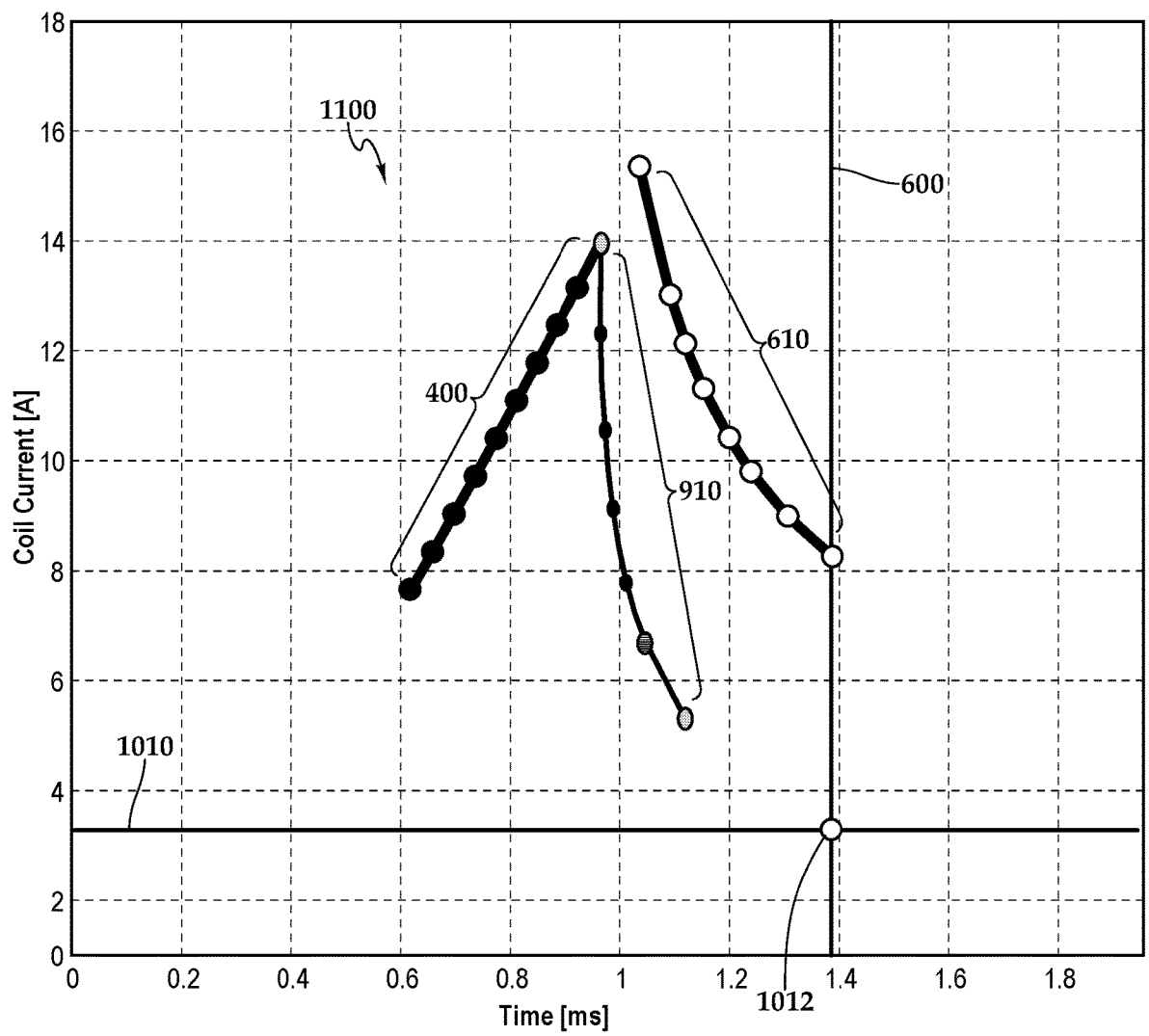
FIG. 11 is a chart showing an example actuator fingerprint.

FIG. 11 is a chart showing an example fluid injector fingerprint 1100. The injector fingerprint 1100 includes the example pull locus 400, the example right margin 600, the example right margin locus 610, the example opening locus 910, and the example current hold value 1010. In the present example, it is shown that the large amount of data collected as the example collection of waveforms 300 of FIG. 3 for a particular fluid injector can be reduced and summarized as the fluid injector fingerprint 1100. As such, the fluid injector fingerprint 1100 can be stored and/or transmitted using a reduced amount of storage and/or data bandwidth compared to storing and/or transmitting the collection of waveforms 300.

In some implementations, one or more additional fluid injector fingerprints can be determined at later times in a manner similar to the way the fluid injector fingerprint 1100 is determined. The fluid injector fingerprint 1100 can then be used as a baseline for comparison to the later fingerprints. Changes between various fingerprints for the same fluid injector can indicate physical changes that have occurred to the fluid injector over time (e.g., mechanical wear, contaminant buildup, breakdown of electrical insulation, leaks). In some implementations, such changes can be analyzed to determine or predict when a fluid injector component may require service or replacement.

Figure 12:
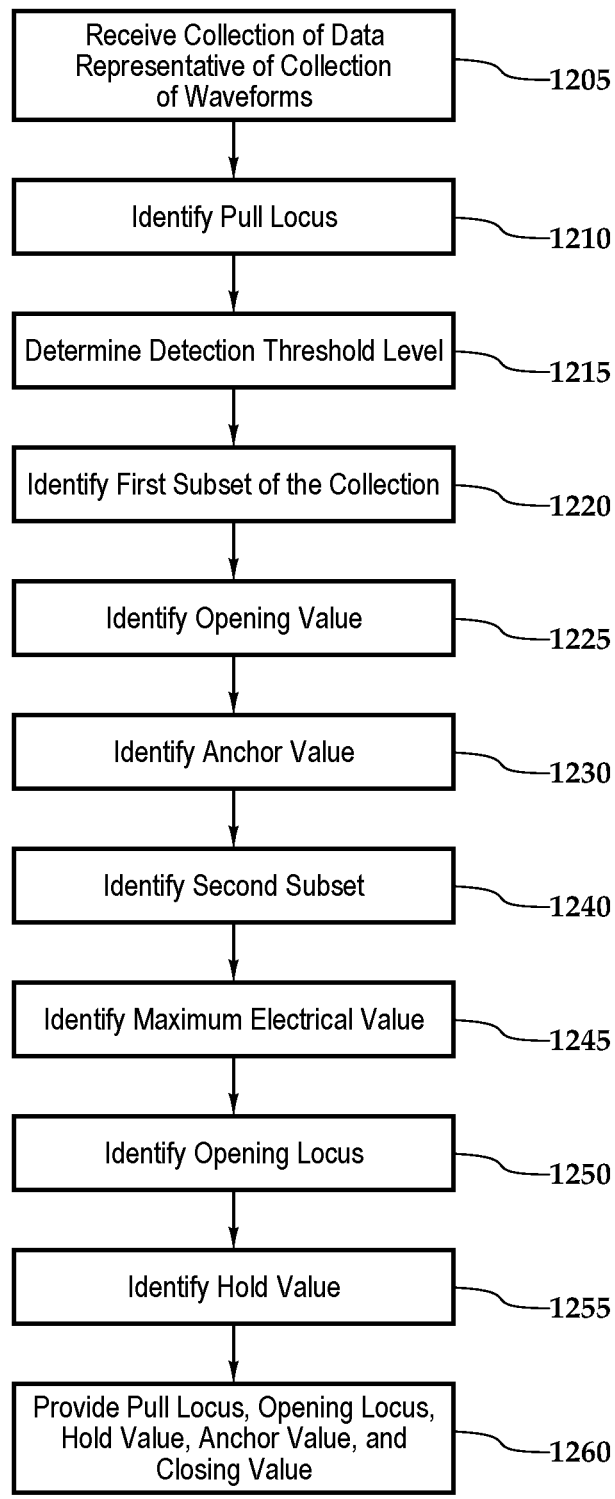
FIG. 12 is a flow chart of an example process for determining the response of a fluid injector.

FIG. 12 is a flow chart of an example process 1200 for determining the mechatronic response of a fluid injector (e.g., for a fuel injector). In some implementations, the process 1200 can be performed by the example controller 100 of FIG. 1.

At 1205, a collection of data representative of a collection of electrical waveforms is received, each waveform corresponding to a selected magnitude of electrical excitation provided to an actuator of a fluid injector. For example, the data representing the collection of example waveforms 300 of FIG. 3 can be received by the controller 100.

At 1210, a pull locus is identified based on the collection of data. For example, the example pull locus 400 of FIG. 4 can be identified. In some implementations, identifying the pull locus can include selecting one or more subsets of the collection of data, each of the selected subsets being representative of a successive pair of the collection of waveforms, each selected pair representing two magnitude-wise successive electrical waveforms, for each of the selected subsets determining a differential waveform based on a difference between the pair of waveforms, determining that the differential waveform includes a zero crossing point, and identifying and adding a time wise local maxima of the second waveform of the selected pair to another subset of data, and providing the other subset as the pull locus associated with the fluid injector. For example, the collection of waveforms 700 can be analyzed to identify the collection of waveforms to include in the pull locus 400 based on the collection of Start-of-Injection (SOI) points 410.

In some implementations, the time wise first local maxima can be the effect of a fluid injector solenoid armature starting to move relative to a de-energized state of the fluid injector. For example, the SOI point 410 can coincide with the BEMF of the corresponding waveform 300 abruptly dropping to zero.

At 1215, a detection threshold level value is determined based on the collection of data. In some implementations, determining a detection threshold level value can include estimating a nominal noise level of one or more of the collection of electrical waveforms. For example, the example collection of waveforms 300 and/or the example collection of differential waveforms 700 can be analyzed to determine a signal to noise ratio that can be used as a threshold to differentiate usable signal from sensor noise.

At 1220, a first subset of the collection of data representative of a selected first electrical waveform of the collection of electrical waveforms is identified based on the detection threshold level value and the collection of data. For example, the example collection of differential waveforms 700 of FIG. 8 can be identified.

At 1225, a representative opening value is identified, based on the collection of data. For example, the example differential waveform 710 of FIG. 8 can be identified in association with the example minimum pull current waveform 402 of FIG. 4.

At 1230, a representative closing value is identified based on the representative opening value and the collection of data. For example, the example differential waveform 720 of FIG. 8 can be identified in association with the example maximum pull current waveform 404 of FIG. 4.

At 1235, an anchor value is identified based on the collection of data and the first subset. For example, the lower opening point 916 can be used to identify the anchor value (e.g., anchor point). In some implementations, identifying the anchor value can include selecting one or more third subsets of the collection of data, each of the selected subsets being representative of a successive pair of the collection of waveforms, each selected pair representing two magnitude-wise successive electrical waveforms, and for each of the selected third subsets determining a differential waveform based on a difference between the pair of waveforms, determining that the differential waveform is the first differential waveform to include a zero crossing point, and provide the zero crossing point as the anchor value associated with the fluid injector. For example, among the collection of differential waveforms 700 can be analyzed to identify the lower opening point 874, which is located at the zero-crossing point of the differential waveform 710.

At 1240, a second subset of the collection of data is identified. The second subset is representative of a selected second electrical waveform of the collection of electrical waveforms, based on the collection of data, the pull locus, the first subset, and the representative opening value. For example, the example right margin locus 610 of FIG. 6 can be identified as a boundary beyond which increasing the pull current may not hasten the valve opening time and can contribute to Joule or resistive heating.

In some implementations, identifying the second subset of the collection of data can include identifying the last value of the pull locus, identifying a subset of the collection of data corresponding to the last value, providing the identified subset as the second subset. For example, the right margin locus 610 can be identified by identifying the right margin point 614 (e.g., the first value of the right margin locus 610), the right margin point 612 (e.g., the intermediate values of the right margin locus 610), and the right margin locus 616 (e.g., the last value of the right margin locus 610).

At 1245, a maximum electrical value is identified based on the second subset. For example, the current level associated with the right margin point 614 can represent the maximum pull current, above which no further actuation performance benefits may be exhibited by the fluid injector.

At 1250, an opening locus is identified based on the collection of data, the anchor value, and the maximum electrical value. For example, the example opening locus 870 of FIG. 8 can be identified based on the opening point 912 and the opening point 914 of FIG. 9, which are based on the collection of waveforms 300.

In some implementations, identifying the opening locus can include selecting one or more third subsets of the collection of data, each of the selected subsets being representative of a successive pair of the collection of waveforms, each selected pair representing two magnitude-wise successive electrical waveforms of the fluid injector, and for each of the selected third subsets determining a differential waveform based on a difference between the pair of waveforms, adding the determined differential waveform to a collection of differential waveform data, identifying the anchor point within the collection of differential waveform data, identifying the maximum electrical value within the collection of differential waveform data, determining a mathematical representation of a line between the anchor value and the maximum electrical value within the collection of differential waveform data, identifying a collection of values within the collection of differential values that intersect the mathematical representation, and providing the identified collection of values as the opening locus associated with the fluid injector. For example, the collection of differential waveforms 700 can be analyzed to identify the peak value of the differential waveform 720 as the upper opening point 872, identify the zero-crossing point of the differential waveform 710 to determine the lower opening point 874, and an interpolation as represented by the line of the opening locus 870 can be performed between the upper opening point 872 and the lower opening point 874, and the intercepts of the interpolation can identify the intermediate opening point 876. The opening points 872, 874, and 876 can be mapped back to the collection of waveforms 300 to identify the corresponding opening points 912, 914, and 916, and define the opening locus 910.

At 1255 a hold value is identified based on the collection of data. In some implementations, identifying the hold value can include identifying a first stable waveform of the fluid injector that includes values described by the pull locus and satisfies one or more stabilization criteria, determining a minimum electrical value based on the first stable waveform, and providing the minimum electrical value as the hold value associated with the fluid injector. For example, the example minimum hold current 1010 of FIG. 10 can be identified based on the example lower point 854.

At 1260 the pull locus, the opening locus, the hold value, the anchor value, and the representative closing value are provided as characteristics associated with the fluid injector (e.g., a fluid injector fingerprint). For example, the pull locus 400, the opening locus 910, the minimum hold current 1010, and the anchor value as represented by the lower opening point 916 are provided as the example fluid injector fingerprint 1100 of FIG. 11.

In some implementations, the collection of fluid injector electrical waveforms can be current waveforms of the fluid injector, the collection of data can be a first collection of fluid injector current measurement values representative of the current waveforms, the pull locus can be a second collection of fluid injector current measurement values, the representative opening value can be a first fluid injector current measurement value, the anchor value can be a second fluid injector current measurement value, the maximum electrical value can be a third fluid injector current measurement value, and the opening locus can be a third collection of fluid injector current measurement values. For example, the collection of example waveforms 300 is a collection of current waveforms, and the pull locus 400, the opening locus 910, the minimum hold current 1010, and the anchor value as represented by the lower opening point 916 are all based on current measurements. In some implementations, however, voltage measurements can be used (e.g., for fingerprinting piezo fluid actuators).

In some implementations, the process can include actuating a solenoid of a fluid injector with a solenoid actuation waveform based on the representative opening value associated with the fluid injector. For example, a solenoid-based fluid injector can be analyzed to determine a fluid injector fingerprint such as the fluid injector fingerprint 1100. Some or all of the data represented by the fluid injector fingerprint 1100 (e.g., the opening locus 910) can be used to define an electrical waveform (e.g., a current waveform) that can be used to actuate the fluid injector solenoid in ways that can be unique to the performance characteristics of that particular fluid injector (e.g., by providing only the minimum amount of power needed to cause actuation, by providing at least the minimum amount to power needed to keep the injector open).

The example system 10 and/or the example process 1200 can be used to identify a fluid injector fingerprint such as the example fluid injector fingerprint 1100. The example fluid injector fingerprint 1100 includes sufficient information to determine a collection of fluid injector characteristics. For example, based on the fluid injector fingerprint 1100, a user can calculate electro-mechanical-hydraulic characteristics of a particular fluid injector that include: coil self-inductance, coil resistance, back-electromotive force, electrical delay or dead time from signal to start of armature motion, armature inertia, effective spring constant of armature spring-mass assembly, spring pre-load, estimated static friction, estimated damping factor, estimated impact velocity of armature, estimated residual magnetism or coercivity, estimated map of electromagnetic force versus coil current and armature position, nominal valve opening and closing time, nominal bounce during opening and closing, fuel trim limits. In some implementations, user inputs and the characteristics measured above can be used to determine limits or thresholds used to indicate diagnostic data such as coil overheating, low ECU voltage, short-circuit to coil or battery or ground, open circuit, bad wiring, valve stickiness (e.g., dirty injector, misfire, poor engine performance, emissions), spring failure, large air gap, magnetic saturation, increased bouncing, poor shot to shot repeatability, delayed valve opening or closing, engine misfiring, stuck open valve or debris (e.g., causing engine knocking), stuck closed valve or debris or lack of fuel pressure (e.g., causing engine misfire), large electrical delay or dead time (e.g., causing ignition delay and/or poor combustion), and large impact velocities (e.g., causing armature wear).

Although the examples in this document are generally described in the context of solenoid operated fluid injectors, other embodiments and implementations exist. For example, the systems and techniques described herein may also be applied to other forms of fluid control employing electromagnetic actuators, such as solenoids, servo motors, stepper motors, linear motors, or combinations of these and any other appropriate form of actuator (e.g., fuel injectors). In another example, the systems and techniques described herein may also be applied to any appropriate form of apparatus for controlling the admission of combustible fluids (e.g., gasoline, diesel), noncombustible fluids (e.g., water), combustible gases (e.g., natural gas, hydrogen), noncombustible gases (e.g., oxygen, nitrogen, carbon dioxide), or vapors (e.g., steam).

In some implementations, fluid injector fingerprints can be descriptive of just an actuator. For example, the coil or the solenoid (e.g., the coil and the armature together) may be fingerprinted outside of the system in which it was or is to be used (e.g., bench testing, without the valve, without fluid). In some implementations, fluid injector fingerprints can be descriptive of the actuator in combination with one or more elements of the environment in which the actuator is used. For example, a fingerprint can be unique for a given combination of actuator, valve, fluid parameters (e.g., density, viscosity, lubricity), fluid inlet parameters (e.g., flow, pressure, volume), fluid outlet parameters (e.g., flow, pressure, volume), temperature, or combinations of these another appropriate parameters of a fluid injection system.

Although a few implementations have been described in detail above, other modifications are possible. For example, the logic flows depicted in the figures do not require the particular order shown, or sequential order, to achieve desirable results. In addition, other steps may be provided, or steps may be eliminated, from the described flows, and other components may be added to, or removed from, the described systems. Accordingly, other implementations are within the scope of the following claims.

What is claimed is:

1. A computer-implemented method for characterizing a fluid injector, comprising:
    measuring a plurality of electrical waveforms corresponding to a selected magnitude of electrical excitation provided to an actuator of a fluid injector;
    determining a collection of data representative of the plurality of electrical waveforms and based on the measuring of the plurality of electrical waveforms;
    identifying characteristics associated with the fluid injector, based on the collection of data, comprising one or more of:
        a pull locus;
        a first subset of the collection of data representative of a selected first electrical waveform of the plurality of electrical waveforms;

a representative opening value;
a representative closing value, further based on the representative opening value;
an anchor value, further based on the first subset;
a second subset of the collection of data, representative of a selected second electrical waveform of the plurality of electrical waveforms, further based on the pull locus, the first subset, and the representative opening value;
a maximum electrical value, based on the second subset;
an opening locus further based on the anchor value, and the maximum electrical value;
a hold value; and
providing the identified characteristics.

2. The method of claim 1, wherein the plurality of electrical waveforms are current waveforms of the fluid injector, the collection of data is a first collection of fluid injector current measurement values representative of the current waveforms, the pull locus is a second collection of fluid injector current measurement values, the representative opening value is a first fluid injector current measurement value, the anchor value is a second fluid injector current measurement value, the maximum electrical value is a third fluid injector current measurement value, and the opening locus is a third collection of fluid injector current measurement values.

3. The method of claim 1, wherein identifying a pull locus further comprises:
selecting one or more third subsets of the collection of data, each of the selected subsets being representative of a successive pair of the plurality of waveforms, each selected pair representing two magnitude-wise successive electrical waveforms;
for each of the selected third subsets:
determining a differential waveform based on a difference between the pair of waveforms;
determining that the differential waveform includes a zero crossing point; and
identifying and adding a time wise local maxima of the second waveform of the selected pair to a fourth subset of data; and
providing the fourth subset as the pull locus associated with the fluid injector.

4. The method of claim 3, wherein the time wise first local maxima is the effect of a solenoid armature of the fluid injector starting to move relative to a de-energized state of the fluid injector.

5. The method of claim 3, wherein identifying a second subset of the collection of data further comprises:
identifying the last value of the pull locus;
identifying a subset of the collection of data corresponding to the last value; and
providing the identified subset as the second subset.

6. The method of claim 1, wherein identifying the anchor value further comprises:
selecting one or more third subsets of the collection of data, each of the selected subsets being representative of a successive pair of the plurality of waveforms, each selected pair representing two magnitude-wise successive electrical waveforms;
for each of the selected third subsets:
determining a differential waveform based on a difference between the pair of waveforms;
determining that the differential waveform is the first differential waveform to include a zero crossing point; and providing the zero crossing point as the anchor value associated with the fluid injector.

7. The method of claim 1, wherein identifying the opening locus further comprises:
selecting one or more third subsets of the collection of data, each of the selected subsets being representative of a successive pair of the plurality of waveforms, each selected pair representing two magnitude-wise successive electrical waveforms of the fluid injector;
for each of the selected third subsets:
determining a differential waveform based on a difference between the pair of waveforms;
adding the determined differential waveform to a collection of differential waveform data;
identifying the anchor point within the collection of differential waveform data;
identifying the maximum electrical value within the collection of differential waveform data;
determining a mathematical representation of a line between the anchor value and the maximum electrical value within the collection of differential waveform data;
identifying a collection of values within the collection of differential values that intersect the mathematical representation; and
providing the identified collection of values as the opening locus associated with the fluid injector.

8. The method of claim 1, wherein determining a detection threshold level value further comprises estimating a nominal noise level of one or more of the plurality of electrical waveforms.

9. The method of claim 1, further comprising actuating a solenoid of the fluid injector with a solenoid actuation waveform based on the representative opening value associated with the fluid injector.

10. The method of claim 1, wherein identifying the hold value further comprises:
identifying a first stable waveform of the fluid injector that includes values described by the pull locus and satisfies one or more stabilization criteria;
determining a minimum electrical value based on the first stable waveform; and
providing the minimum electrical value as the hold value associated with the fluid injector.

11. A system for characterizing an injector for a fluid injector, comprising:
a data processing apparatus; and
a computer memory storage device storing instructions executable by a computer device and that upon such execution cause the computer device to perform operations comprising:
measuring a plurality of electrical waveforms corresponding to a selected magnitude of electrical excitation provided to an actuator of a fluid injector;
determining a collection of data representative of the plurality of electrical waveforms and based on the measuring of the plurality of electrical waveforms;
identifying characteristics associated with the fluid injector, based on the collection of data, comprising one or more of:
a pull locus;
a first subset of the collection of data representative of a selected first electrical waveform of the plurality of electrical waveforms;
a representative opening value;
a representative closing value, further based on the representative opening value;

an anchor value, further based on the first subset;
a second subset of the collection of data, representative of a selected second electrical waveform of the plurality of electrical waveforms, further based, the pull locus, the first subset, and the representative opening value;
a maximum electrical value, based on the second subset;
an opening locus further based on the anchor value, and the maximum electrical value;
a hold value; and
providing the identified characteristics.

12. The system of claim 11, wherein the plurality of electrical waveforms are current waveforms of the fluid injector, the collection of data is a first collection of fluid injector current measurement values representative of the current waveforms, the pull locus is a second collection of fluid injector current measurement values, the representative opening value is a first fluid injector current measurement value, the anchor value is a second fluid injector current measurement value, the maximum electrical value is a third fluid injector current measurement value, and the opening locus is a third collection of fluid injector current measurement values.

13. The system of claim 11, wherein identifying a pull locus further comprises:
selecting one or more third subsets of the collection of data, each of the selected subsets being representative of a successive pair of the plurality of waveforms, each selected pair representing two magnitude-wise successive electrical waveforms;
for each of the selected third subsets:
determining a differential waveform based on a difference between the pair of waveforms;
determining that the differential waveform includes a zero crossing point; and
identifying and adding a time wise local maxima of the second waveform of the selected pair to a fourth subset of data; and
providing the fourth subset as the pull locus associated with the fluid injector.

14. The system of claim 13, wherein the time wise first local maxima is the effect of a solenoid armature of the fluid injector starting to move relative to a de-energized state of the fluid injector.

15. The system of claim 13, wherein identifying a second subset of the collection of data further comprises:
identifying the last value of the pull locus;
identifying a subset of the collection of data corresponding to the last value; and
providing the identified subset as the second subset.

16. The system of claim 11, wherein identifying the anchor value further comprises: selecting one or more third subsets of the collection of data, each of the selected subsets being representative of a successive pair of the plurality of waveforms, each selected pair representing two magnitude-wise successive electrical waveforms;
for each of the selected third subsets:
determining a differential waveform based on a difference between the pair of waveforms;
determining that the differential waveform is the first differential waveform to include a zero crossing point; and
provide the zero crossing point as the anchor value associated with the fluid injector.

17. The system of claim 11, wherein identifying the opening locus further comprises:
selecting one or more third subsets of the collection of data, each of the selected subsets being representative of a successive pair of the plurality of waveforms, each selected pair representing two magnitude-wise successive electrical waveforms of the fluid injector;
for each of the selected third subsets:
determining a differential waveform based on a difference between the pair of waveforms;
adding the determined differential waveform to a collection of differential waveform data;
identifying the anchor point within the collection of differential waveform data;
identifying the maximum electrical value within the collection of differential waveform data;
determining a mathematical representation of a line between the anchor value and the maximum electrical value within the collection of differential waveform data;
identifying a collection of values within the collection of differential values that intersect the mathematical representation; and
providing the identified collection of values as the opening locus associated with the fluid injector.

18. The system of claim 11, wherein determining a detection threshold level value further comprises estimating a nominal noise level of one or more of the plurality of electrical waveforms.

19. The system of claim 11, further comprising actuating a solenoid of the fluid injector with a solenoid actuation waveform based on the representative opening value associated with the fluid injector.

20. The system of claim 11, wherein identifying the hold value further comprises:
identifying a first stable waveform of the fluid injector that includes values described by the pull locus and satisfies one or more stabilization criteria;
determining a minimum electrical value based on the first stable waveform; and
providing the minimum electrical value as the hold value associated with the fluid injector.

* * * * *